United States Patent
Yamazaki et al.

[11] Patent Number: 6,090,527
[45] Date of Patent: Jul. 18, 2000

[54] ELECTRON BEAM EXPOSURE MASK AND METHOD OF MANUFACTURING THE SAME AND ELECTRON BEAM EXPOSURE METHOD

[75] Inventors: Satoru Yamazaki; Kiichi Sakamoto; Hiroshi Yasuda, all of Kawasaki; Takayuki Sakakibara; Satoru Sagoh, both of Kasugai, all of Japan

[73] Assignee: Fujitsu Limited, Kawasaki, Japan

[21] Appl. No.: 09/087,869

[22] Filed: Jun. 1, 1998

Related U.S. Application Data

[60] Division of application No. 08/590,827, Jan. 24, 1996, Pat. No. 5,849,437, which is a continuation-in-part of application No. 08/408,818, Mar. 23, 1995, abandoned.

[30] Foreign Application Priority Data

| Mar. 25, 1994 | [JP] | Japan | 6-056279 |
| Jan. 24, 1995 | [JP] | Japan | 7-009360 |
| Feb. 8, 1995 | [JP] | Japan | 7-020786 |

[51] Int. Cl.[7] ............................... G03F 9/00; G03C 5/00
[52] U.S. Cl. ......................................................... 430/296
[58] Field of Search ............................... 430/5, 296, 322; 250/492.22

[56] References Cited

U.S. PATENT DOCUMENTS

| 4,426,584 | 1/1984 | Bohlen et al. | 430/296 |
| 4,735,881 | 4/1988 | Kobayashi et al. | 430/296 |
| 5,008,553 | 4/1991 | Abe | 430/296 |
| 5,148,033 | 9/1992 | Yamada et al. | 250/492.2 |
| 5,424,173 | 6/1995 | Wakabayashi et al. | 430/296 |

FOREIGN PATENT DOCUMENTS

| 0 364 929A2 | 4/1990 | European Pat. Off. . |
| 59-222840 | 12/1984 | Japan . |
| 91-34667 | 8/1986 | Japan . |

OTHER PUBLICATIONS

T.H.P. Chang, "Proximity Effect in Electron–Beam Lithography", J. Vac. Sci. Technol., vol. 12, No. 6, Nov./Dec. 1975, pp 1271–1275.

*Primary Examiner*—S. Rosasco
*Attorney, Agent, or Firm*—Arent Fox Kintner Plotkin & Kahn

[57] ABSTRACT

In an exposure mask of the present invention, a plurality of opening regions are disposed via crossbeams, each having a size not to be resolved, along peripheral edges of island-like patterns and peninsula-like patterns for shielding transmission of charged particles.

9 Claims, 34 Drawing Sheets

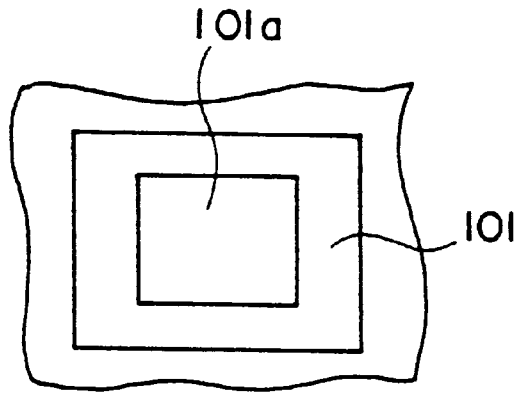
FIG.1A
(Prior Art)
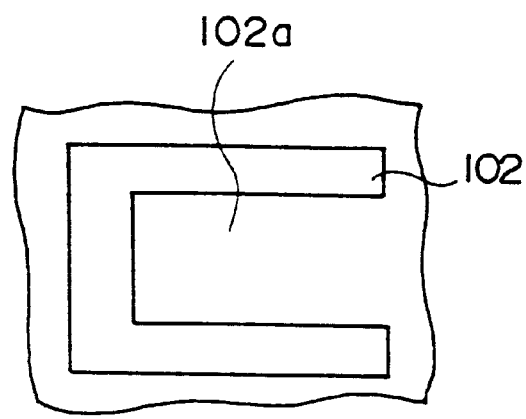
FIG.1B
(Prior Art)
FIG.2A
(Prior Art)
FIG.2B
(Prior Art)
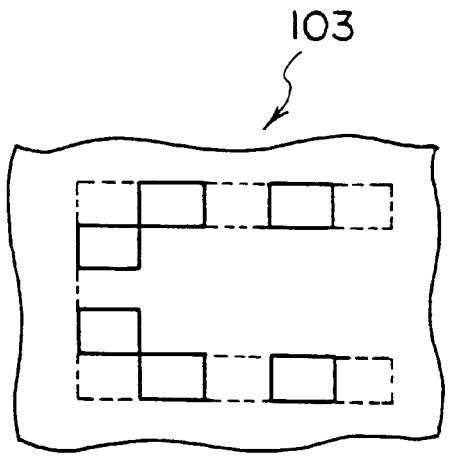
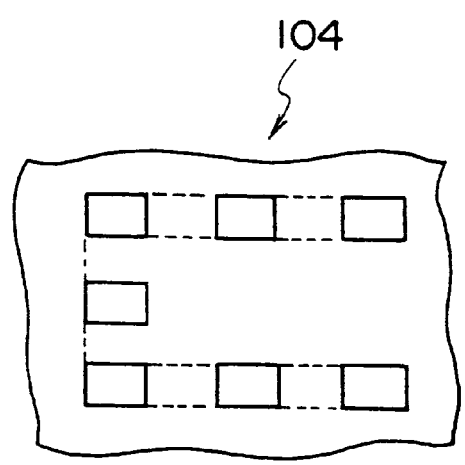

FIG.28
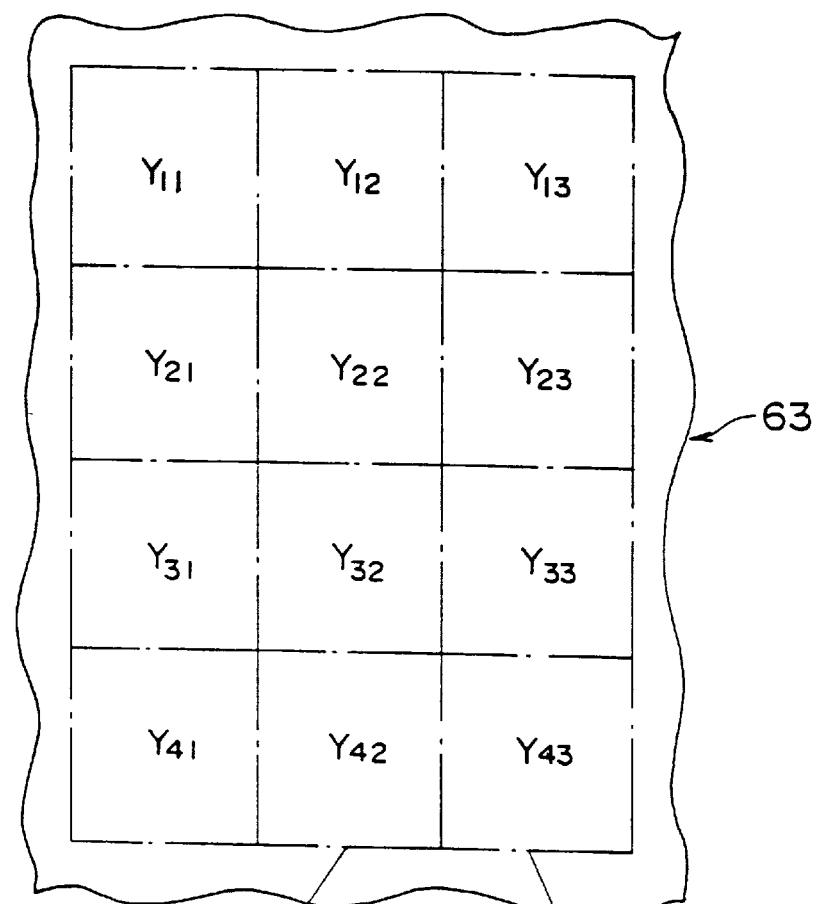
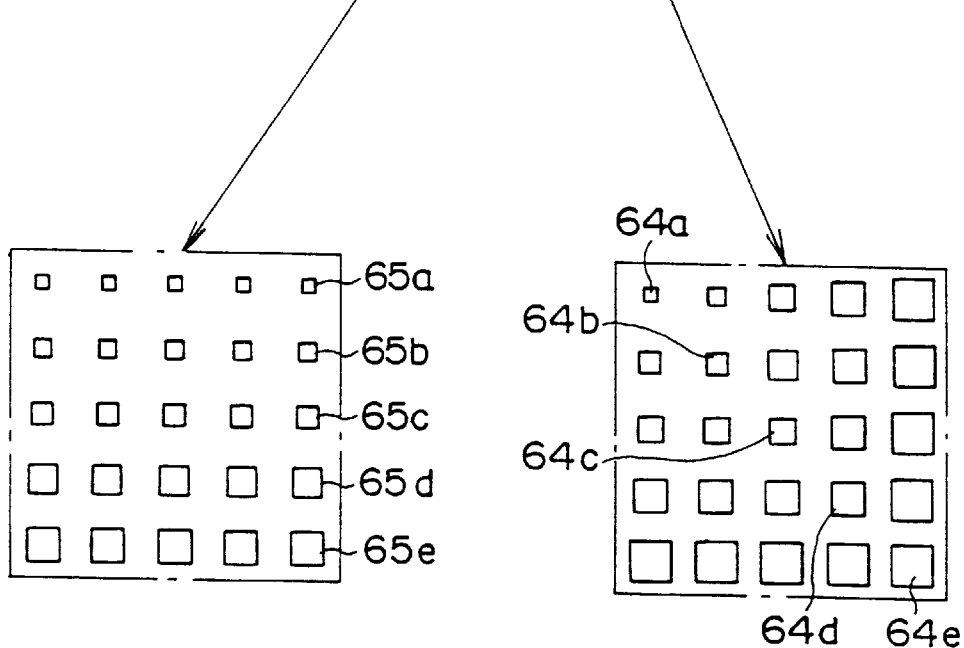

FIG.42

```
Caluculating a reflection strength
distribution of charged particle
in a resist layer, the charged particles
having been transmitted throiugh an
exposure mask
```
↓
```
Finding regions in which the reflection
intensity decreases as a distance from a
center of an opening in said exposure
mask increase
```
↓
```
Making an auxiliary exposure mask having
a plurality of openings in a mask substrate,
each area of the openings increases as the
reflection intensity in the regions decreases
```
↓
```
Exposing the resist layer through the
auxiliary exposure mask to decrease
reflection strength change in said regions
``` ively used for exposing the positive type resist, the capacitor must be patterned to be surrounded by an opening portion 101 formed in a shape of a ring, as shown in FIG. 1A. Also, the gate electrode of the transistor must be patterned to be surrounded by an opening portion 102 formed like a U-shape, as shown in FIG. 1B. Now the pattern 101*a* surrounded by the ring opening portion 101 is referred to as an island-like pattern hereinafter, and the pattern 102*a* surrounded by the U-shaped opening is also referred to as a peninsula-like pattern or a tongue-like pattern hereinafter.
ELECTRON BEAM EXPOSURE MASK AND METHOD OF MANUFACTURING THE SAME AND ELECTRON BEAM EXPOSURE METHOD This application is a divisional application filed under 37 CFR §1.53(b) of parent application Ser. No. 08/590,827, filed Jan. 24, 1996 now U.S. Pat. No. 5,849,437, which in turn is a continuation-in-part application of application Ser. No. 08/408,818, filed Mar. 23, 1995 now abandoned.

BACKGROUND OF THE INVENTION

1. Field of the Invention

The present invention relates to an electron beam exposure mask and a method of manufacturing the same, and an electron beam exposure method.

2. Description of the Prior Art

Recently, an integration density of semiconductor integrated circuits (IC) have been improved more and more, and functions of the ICs have been increased. Thus, in the fields of industry such as computers, communications, and mechanical control where the ICs are employed, progress of technology has been expected widely. There exists some ICs such as DRAMS wherein a fourfold increase in integration density has been achieved in the past two or three years. Such high integration can be attained on the basis of the progress in fine pattern technology.

In an electron beam exposure technology, fine patterns of less than 0.05 μm can be obtained if an alignment accuracy of an exposure mask can be achieved within less than 0.02 μm. But, in such cases, it has been considered that such fine patterns cannot be employed in mass production of the LSI because of low throughput. However, in recent years, the throughput of about two sheets per hour has been realized by using a block exposure scheme or a blanking aperture array (BAA) scheme.

In such cases, a superfine pattern formation scheme, wherein both a pattern width and a pattern distance can be formed to be less than 0.20 μm, is required for lithography technology used for manufacturing the semiconductor devices.

In case a resist is exposed to form such superfine patterns, a positive type resist is often advantageous compared to a negative type resist. In the negative type resist, a crosslinking reaction is caused in the resist material by an irradiation of the electron beam. Since the negative type resist becomes inflated by absorbing a developer in developing process to thus make the superfine patterns swell by the development process, dimensional accuracy of the superfine patterns is not assured. On the contrary, in the positive type resist, the crosslinked resist material is cut off by the electron beam or the energy beam. Since the positive type resist in the region where the electron beam is irradiated is melted down, the dimensional accuracy of the superfine patterns is readily assured.

Even if patterns of gate electrodes and capacitor electrodes of the transistor are exposed by employing a so-called "block exposure" scheme wherein the electron beam is shaped by means of a transmission mask formed of silicon, the dimensional accuracy of the gate electrodes can be easily obtained and surface areas of the capacitor electrodes can be formed widely, when they are exposed on the positive type resist. Since a capacitor is used as a charge storage capacitor of a memory device, for example, a large size capacitor is preferable.

In case the patterns of the gate electrode and the capacitor are formed in the block exposure transmission mask (also referred to as "block mask" hereinafter) used for exposing the positive type resist, the capacitor must be patterned to be surrounded by an opening portion 101 formed in a shape of a ring, as shown in FIG. 1A. Also, the gate electrode of the transistor must be patterned to be surrounded by an opening portion 102 formed like a U-shape, as shown in FIG. 1B. Now the pattern 101*a* surrounded by the ring opening portion 101 is referred to as an island-like pattern hereinafter, and the pattern 102*a* surrounded by the U-shaped opening is also referred to as a peninsula-like pattern or a tongue-like pattern hereinafter.

However, since the island-like pattern 101*a* surrounded by the ring opening portion 101 is formed in the air as it is, it is not of practical use. In addition, the peninsula-like pattern 102*a* surrounded by the U-shaped opening portion 102 has small mechanical strength.

Therefore, the island-like pattern 101*a* and the peninsula-like pattern 102*a* are supported by narrow crossbeams (referred to as bridging portions hereinafter) which can not shield the exposure electron beam, or otherwise, as shown in FIGS. 2A and 2B, the resist is exposed with 2 or more shots using plural masks 103 and 104, each composed of a plurality of divided opening patterns. Such a technique is disclosed in Unexamined Patent Publication (KOKAI) 59-222840 (EP Patent Application No. 83105177.6 filed on May 25, 1983), for example. However, it is apparent that, if this technique is employed, the throughput is inevitably decreased to about half or less.

Further, when lattice-like meshes formed by a narrow wire not exposed is used, some of the meshes can be covered by a thin film so as not to transmit the electron beam. As a result, the exposure mask having the island-like patterns and the peninsula-like patterns thereon can be formed in the exposure mask.

Furthermore, the exposure mask used for forming the patterns by using a diffraction effect of light is disclosed in Patent Application Publication (KOKOKU) 61-34667. In this exposure mask, as shown in FIG. 3A, "a plurality of small holes 105 are so arranged thickly that light waves diffracted by adjacent small holes 105 are overlapped with each other on the resist" to thus form a desired pattern.

According to the above exposure mask using the meshes and the above exposure mask using the plurality of small holes to form the desired pattern, one desired pattern is formed by the plural opening portions, and the lights are diffracted into rear sides of the crossbeams dividing these opening portions. Thereby, the patterns corresponding to the crossbeams are not resolved substantially on the resist which is formed on the wafer.

If the exposure mask is used to pass or transmit the light such as ultraviolet rays and X-rays, no significant problems occur. However, if an ionizing radiation such as an electron beam with high energy is irradiated onto the exposure mask, it causes the exposure mask to have a high temperature so that the exposure mask will be melted or elongated.

In particular, in order to improve the throughput of the electron beams exposure scheme, if an irradiation time is shortened by increasing the electron beam current density up to 40 A/cm$^2$ or more, or otherwise if the electron beam accelerated more than 40 kV or more is employed, the above meshes cannot be employed as the exposure mask for the charged particles. In general, as the exposure mask for the charged particles such as the electron beam, it has been proposed that the silicon plate is used as the material and that hole portions are opened by anisotropic etching and trench etching techniques. Since the silicon plate is more stiff than both a thin metal plate and a crystal structure, the exposure mask made of silicon is not melted by the energy beam.

When, using the exposure mask made of the silicon substrate, the island-like patterns and the peninsula-like patterns described above are exposed, the following problems can occur.

(1) Since heat is accumulated in non-opening regions (energy beam shielding regions) in the exposure mask, the heat must be radiated effectively. If the heat is accumulated in the exposure mask, the dimensional accuracy of the exposure mask is deteriorated due to thermal expansion, or destruction of the exposure mask is caused due to stress generated by the thermal expansion.

(2) The island-like patterns and the peninsula-like patterns in the exposure mask must have sufficient mechanical strength. Therefore, the frame portions dividing the exposure mask into the plural opening regions have to be formed widely. However, the crossbeam portions are resolved as the patterns on the resist if they are formed too widely, so that object of the frame portions cannot be attained.

(3) A layout of the crossbeam portions must be so designed that a pattern shape to be exposed can be formed precisely. In other words, as described above, after the exposure mask having the above meshes or small holes is exposed by the charged particles (electron beam), it has not been apparent how to obtain the resist patterns with high accuracy. For example, in the pattern wherein a plurality of regions divided by the meshes are covered selectively by the thin film, it is hard to attain the pattern shapes with high accuracy Moreover, if, as shown in FIG. 3A, the plurality of holes are disposed merely in vertical and horizontal directions, the pattern 106 having a jagged edge is formed as shown in FIG. 3B, so that the precise pattern cannot be formed.

In addition, charged particles irradiated through the opening regions of the exposure mask are distributed unequally on the resist when they pass or transmit near the edges of the opening regions. Thus this causes the degraded pattern accuracy. Note that this phenomenon is not restricted to the opening regions surrounding the island-like patterns and the peninsula-like patterns.

SUMMARY OF THE INVENTION

It is an object of the present invention to provide an electron beam exposure mask used for forming resist patterns with high accuracy and a method of manufacturing the same, and an electron beam exposure method.

According to an aspect of the present invention, a plurality of opening regions which are aligned along a peripheral edge of a charged particle shielding pattern bridging portions (crossbeam), each having an unresolved size, are formed on the electron beam exposure mask.

In this exposure mask, patterns of bridging portions disposed between the opening regions are not resolved on the resist and are thus eliminated when they are exposed. Therefore, when the island-like patterns and the peninsula-like patterns for shielding the electron beam are formed on the exposure mask, strength of the exposure mask can be increased. In addition, since patterns disposed within one electron beam shot area can be formed at a time by one shot of the electron beam, a throughput of the exposure is not lowered.

Also, since a bulge of the opening portion can be easily estimated by the proximity effect caused by an isolated opening region, the pattern accuracy can be improved by forming the opening pattern narrowly by a dimension of the bulge. Moreover, even if a plurality of opening regions are aligned in plural directions, corners of the patterns surrounded by the opening regions can be prevented from being rounded of f since the opening regions disposed in intersecting regions are formed smaller in size than those of other opening regions.

According to another aspect of the present invention, the charged particles having a intensity distribution to make the inclination of the distribution of the reflected electron intensity flat are irradiated in an inclined reflected electron intensity region in a latent image pattern formed on the resist. Therefore, since an amount of the charged particles required for resolving the image is supplied in the region wherein the exposure amount becomes insufficient because of the reduction of the distribution of the reflected electron intensity, the pattern of the latent image with high accuracy can be formed on the resist.

Further, in a case where the charged particles having different distribution of the electron beam intensity are irradiated, the exposure mask which has a plurality of electron beam transmission holes, each having an aperture region in proportion to a transmission electron beam amount, may be used. Therefore, the charged particles having unequal distribution of the electron beam intensity can be irradiated on the resist even by one electron beam shot.

Furthermore, before such exposure mask is formed, patterns to be exposed on the resist are first divided into a plurality of rectangular regions, then the reflected electron intensities are measured at four corners of each rectangular region, then changes in reflected electron intensities are checked by comparing reflected electron intensities sequentially, and then change rates are calculated if the change of the reflected electron intensities are found. In turn, electron beam transmitting holes having their size in proportional to the change rates are formed on the exposure mask. This way, sizes and dimensions of the electron beam transmitting holes can be determined relatively readily.

According to still another aspect of the present invention, using the exposure mask having a plurality of electron beam transmitting holes formed in a matrix fashion, non-pattern forming regions of the positive type resist, for example, are exposed. Therefore, by reducing the exposure amount of the non-pattern forming regions, the proximity effect affected on adjacent pattern forming regions can be suppressed, so that the patterns are formed on the resist with high accuracy.

In this case, the patterns can be formed with higher accuracy by setting the different exposure amount respectively on the pattern forming region and the non-pattern forming region.

In addition, in the exposure mask having the plurality of electron beam transmitting holes formed in the non-pattern forming regions in a matrix fashion, an entire region including the pattern forming region and the non-pattern forming region is divided into plural sections, and sizes and pitches of the electron beam transmitting holes are determined based on ratios of exposure amount/area in these sections. Thus it can be easily determined whether or not the pattern forming region is over-exposed.

It is another object of the present invention to provide a charged particle beam exposure mask capable of preventing degradation in pattern precision due to proximity effect without lowering throughput of exposure process, and to provide a method of forming a mask allowing an amount of charged particles due to proximity effect to be corrected.

In the charged particle beam exposure mask according to the present invention, one pattern is partitioned into a plurality of rectangles, and transmission holes of large size are formed in respective rectangles of the plurality of rectangles wherein an amount of charged particles due to proximity effect is small, whereas transmission holes of small size are formed in respective rectangles wherein an amount of charged particles due to proximity effect is large. As a result, an irradiating amount of charged particles can be controlled, so that bulge, reduction or elimination of transfer patterns due to proximity effect can be removed. Latent images can therefore be formed on a resist with good precision.

Furthermore, if the charged particle exposure mask is employed, the exposure process can be accomplished at a time to thus improve throughput. Since respective transmission holes are partitioned by means of frames, strength of the mask is in no way lowered. The frames may be formed by the mask substrate.

Moreover, when such a charged particle beam exposure mask is fabricated, first an amount of charged particles due to proximity effect is in advance calculated in respective regions, then sizes of transmission holes are contracted in respective regions wherein an amount of charged particles due to proximity effect is large while sizes of transmission holes are magnified in respective regions wherein an amount of charged particles due to proximity effect is small. As a result, based upon the proximity effect caused in neighboring patterns as well as the concerned pattern itself into consideration, sizes of respective transfer holes can be easily determined.

BRIEF DESCRIPTION OF THE DRAWINGS

FIG. 1A is a plan view showing a pattern of the first conventional exposure mask;

FIG. 1B is a plan view showing another pattern of the first conventional exposure mask;

FIG. 2A is a plan view showing a pattern of the second conventional exposure mask;

FIG. 2B is a plan view showing another pattern of the second conventional exposure mask;

FIG. 28 is a plan view showing an auxiliary exposure mask used for the electron beam exposure method according to the second embodiment of the present invention;

Figure 43:
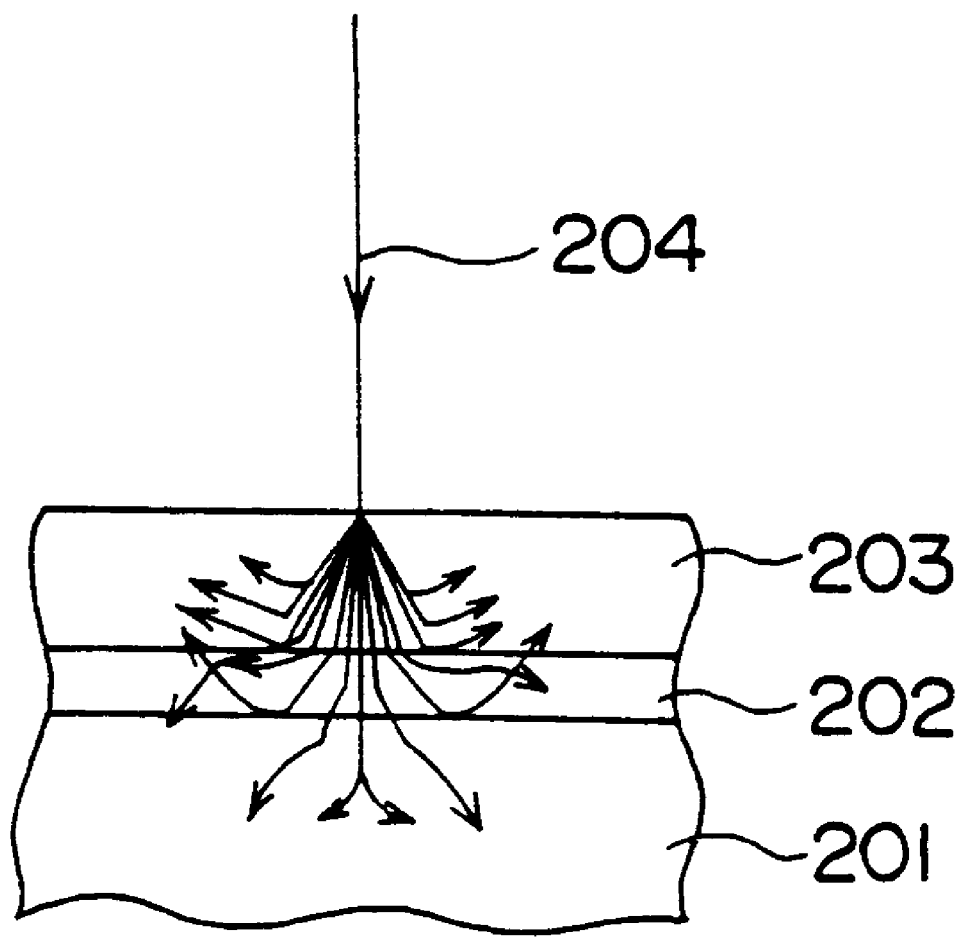
Figure 44:
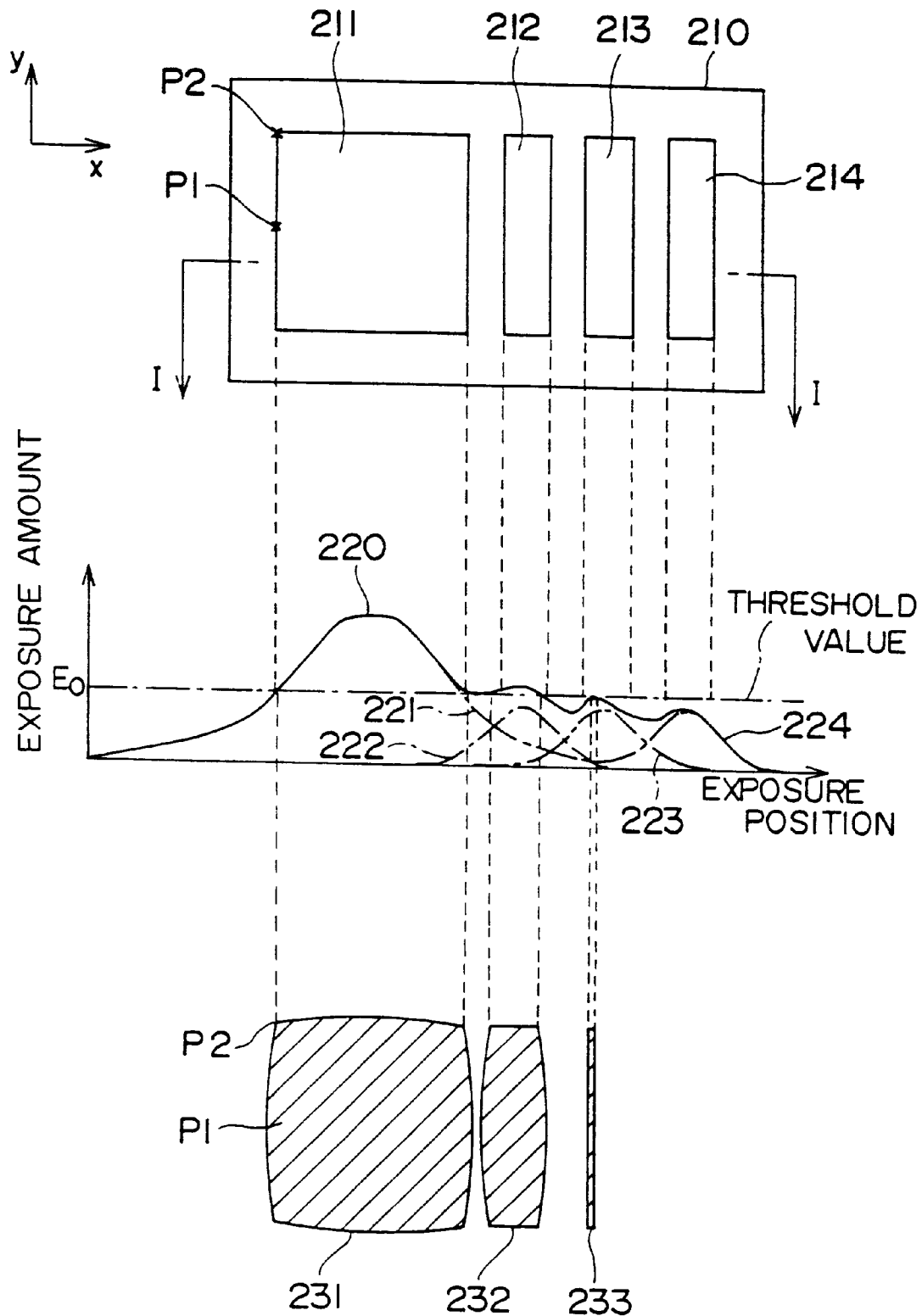
Figure 45A:
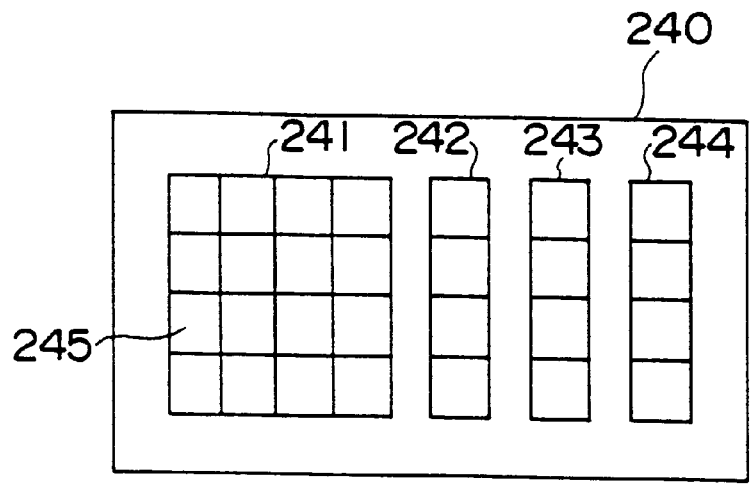
Figure 45B:
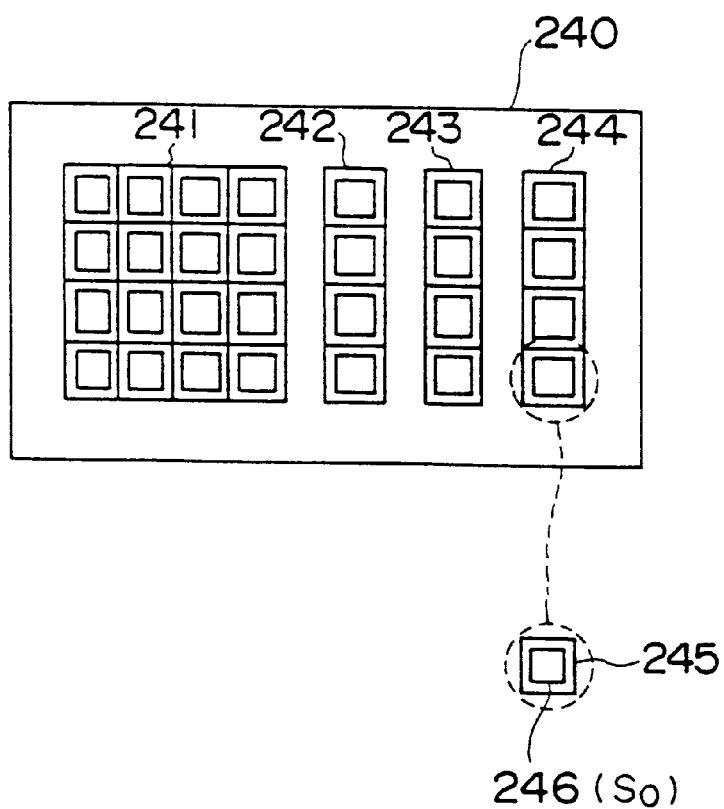
Figure 46:
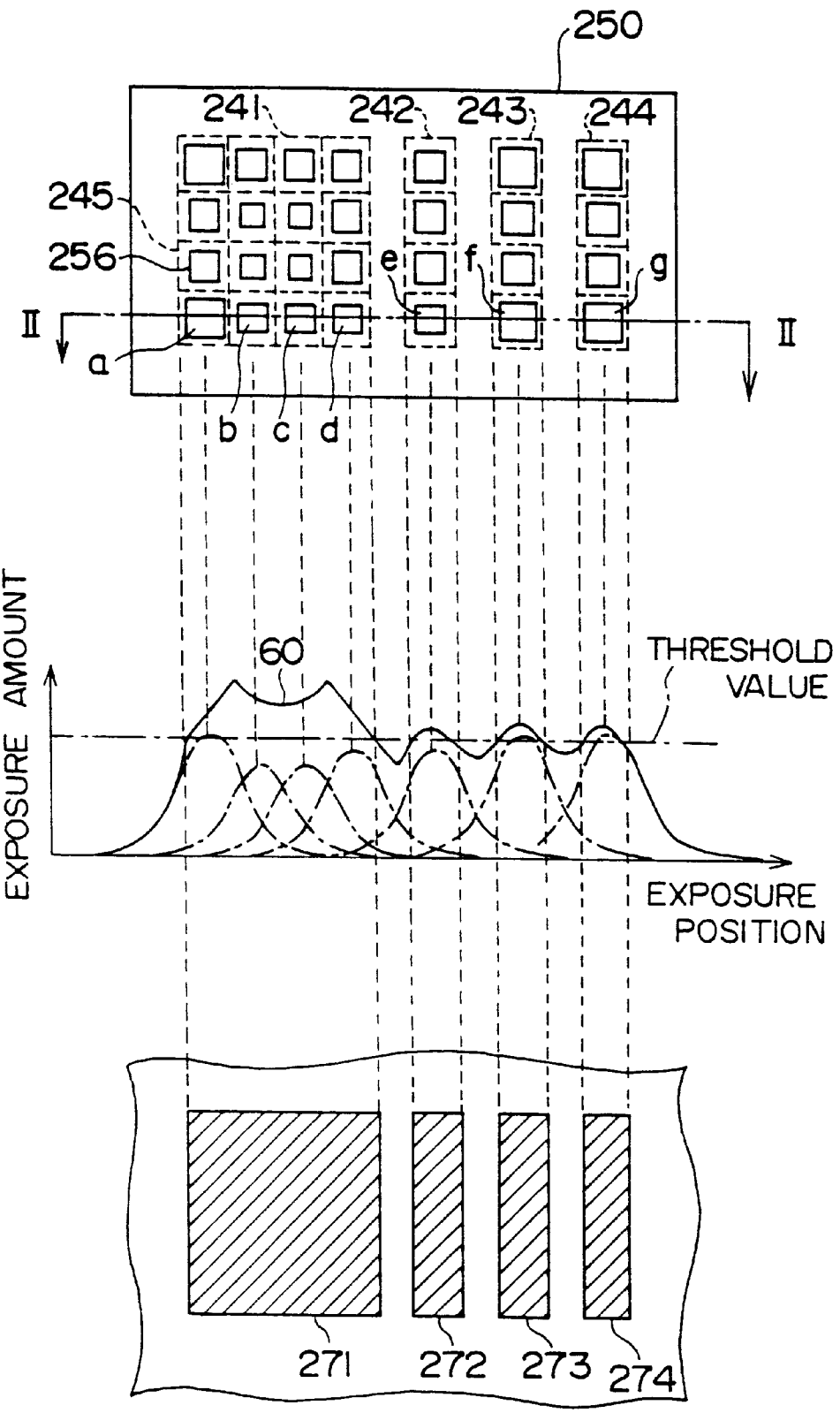
Figure 47:
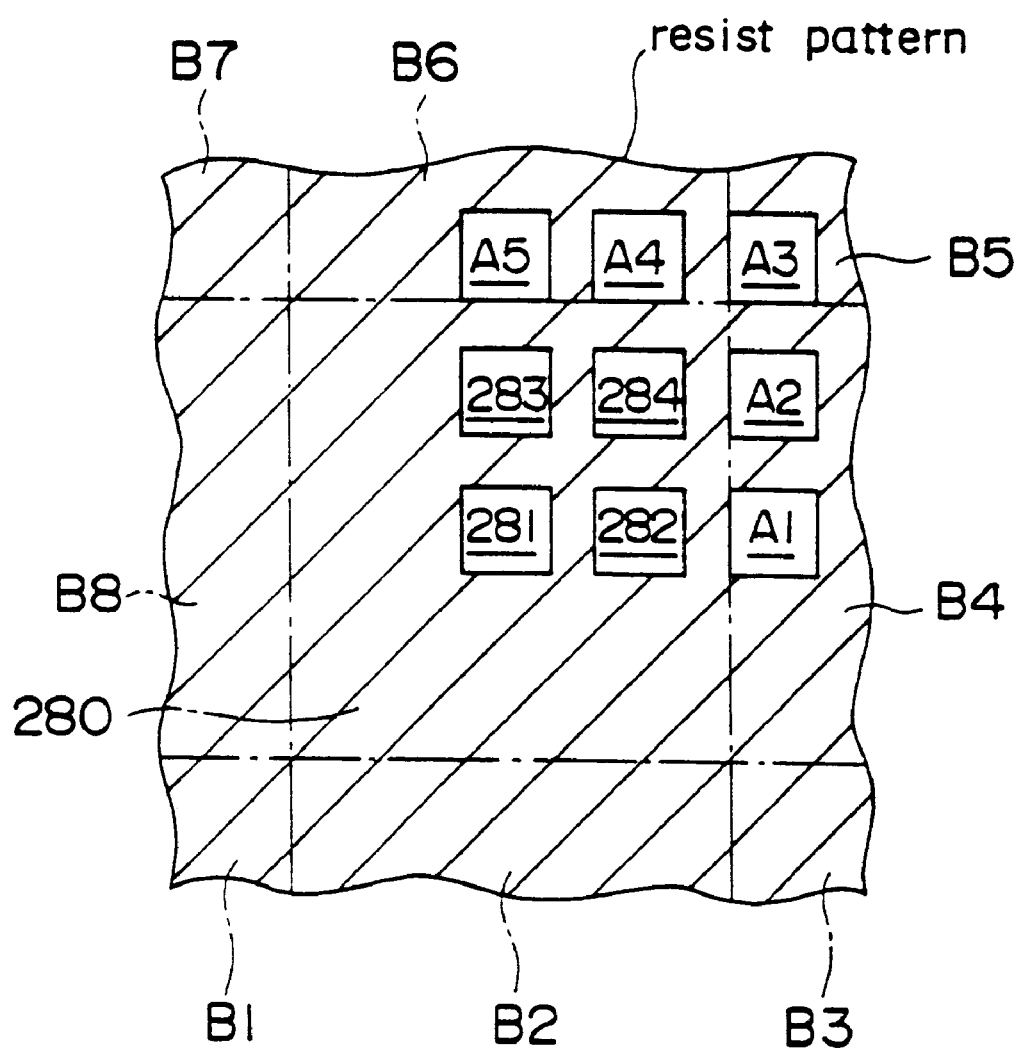
Figure 48:
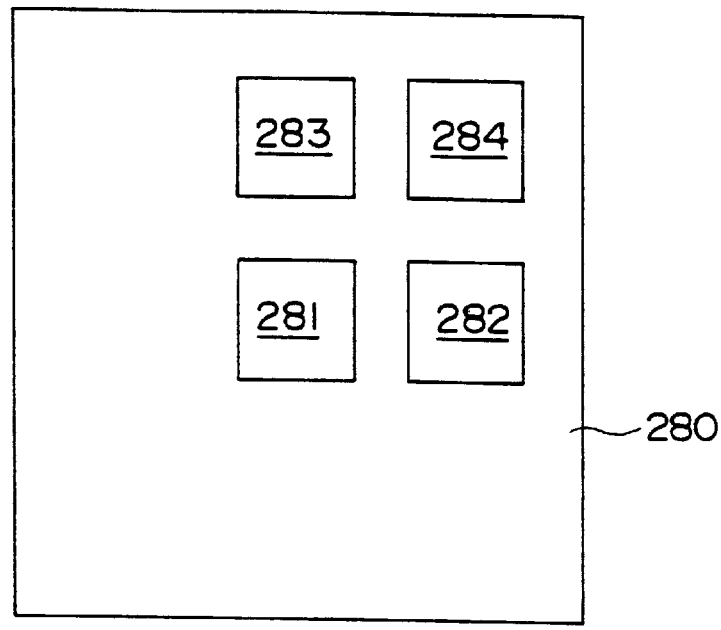
Figure 49:
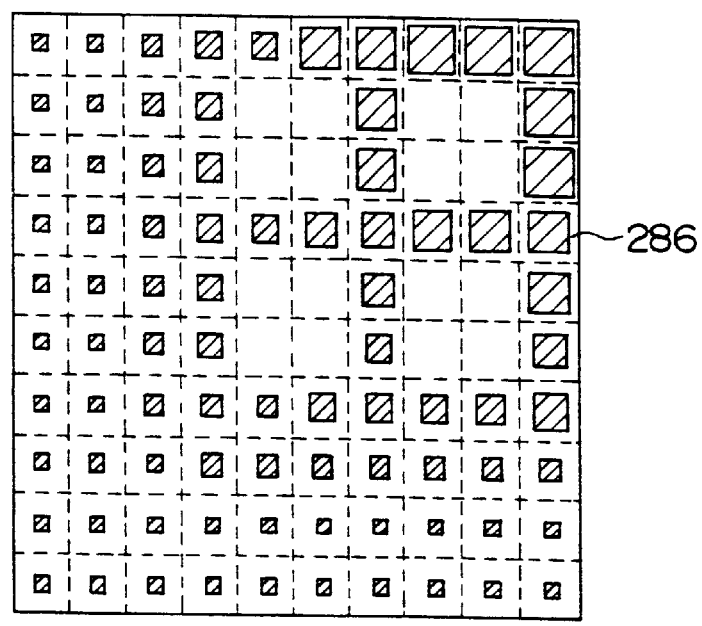
Figure 50:
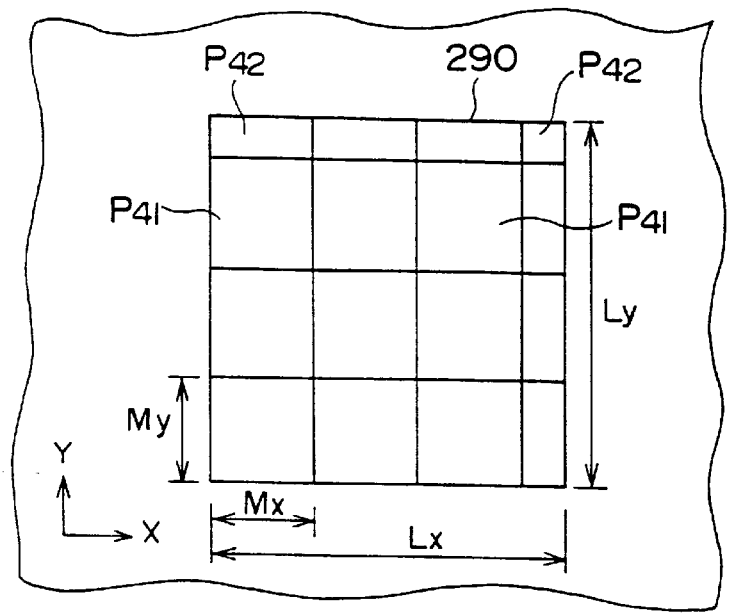
Figure 51:
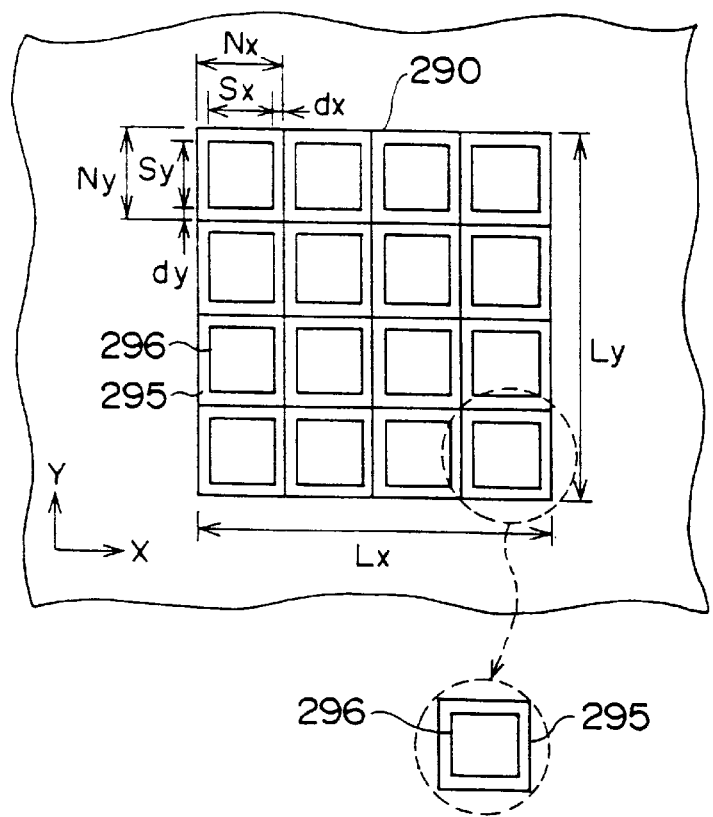
Figure 52:
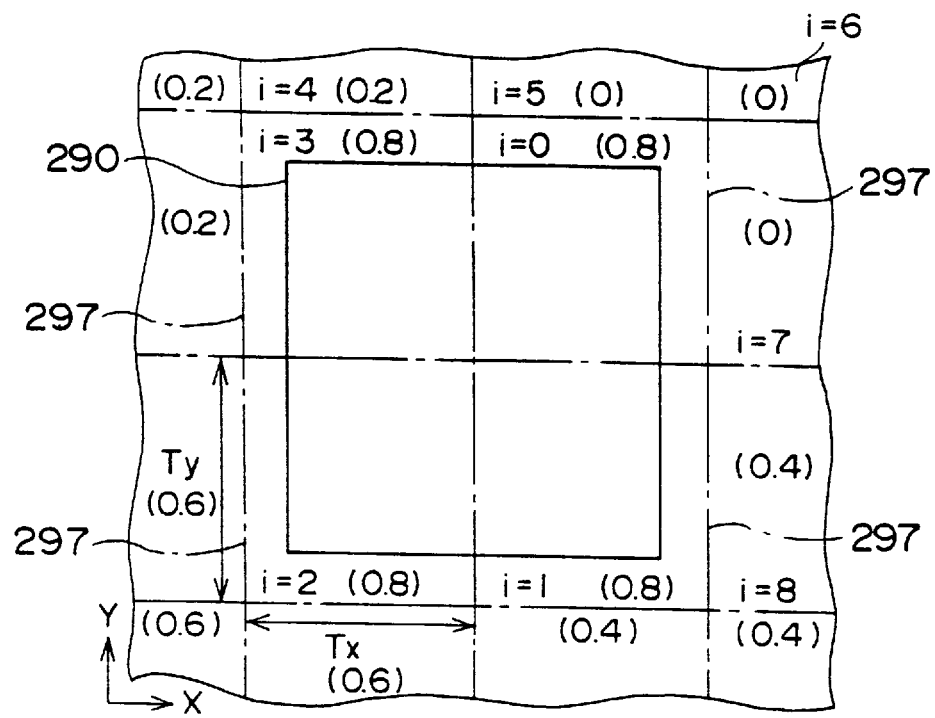
Figure 53:
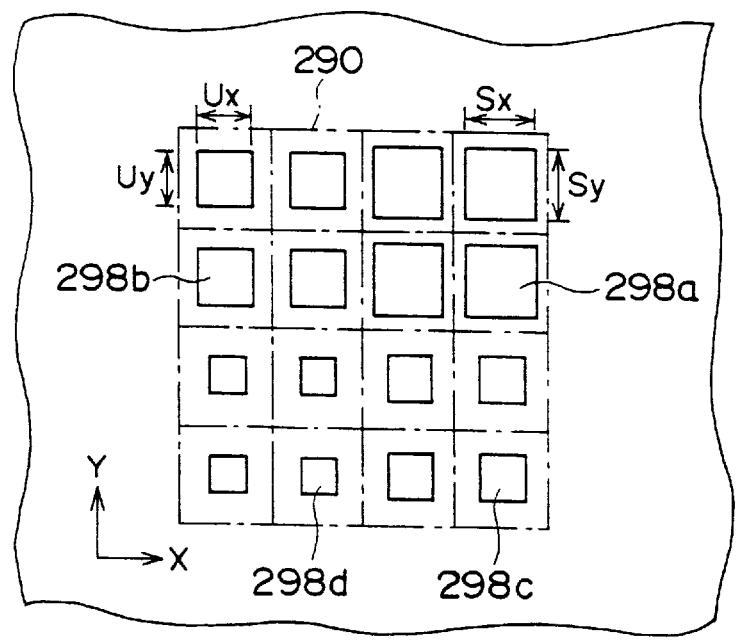

Preferred embodiments of the present invention will now be described hereinafter with reference to the accompanying drawings;

FIG. 42 is a flow chart of the manufacturing steps of the auxiliary exposure mask of the second embodiment of the present invention;

FIG. 43 is a fragmental sectional view illustrative of the proximity effect in the exposure object;

FIG. 44 is a view showing exposure amount and resultant transfer patterns in connection with the conventional mask arrangements;

FIGS. 45A and 45B are plan views showing respectively a method of forming a mask according to a first example of a fourth embodiment of the present invention;

FIG. 46 is a view showing exposure amount and resultant transfer patterns in connection with mask arrangements in FIG. 45B according to the first example of the fourth embodiment of the present invention;

FIG. 47 is a fragmental plan view showing transfer patterns according to a second example of the fourth embodiment of the present invention;

FIG. 48 is a plan view showing the transfer patterns of the block shown in FIG. 47 in an enlarged fashion;

FIG. 49 is a plan view showing the mask pattern used to form the transfer patterns shown in FIG. 48;

FIGS. 50 and 51 are plan views showing respectively a method of forming rectangular patterns of a mask according to a third example of the fourth embodiment of the present invention; and FIGS. 52 and 53 are plan views showing respectively the method of forming the rectangular patterns of the mask according to the third example of the fourth embodiment.

DETAILED DESCRIPTION OF THE PREFERRED EMBODIMENTS

First Embodiment

The first embodiment of the present invention will be described below with reference to FIGS. 4 to 19.

(1) Explanation of a Pattern of an Exposure Mask According to the First Embodiment FIGS. 4, 6, 8, 10, 12 and 14 are plan views showing patterns of electron beam exposure masks according to the first embodiment of the present invention. FIGS. 5, 7, 9, 11 and 13 are microphotographs showing patterns of EB resists obtained by employing these exposure masks.

In order to obtain an optimal pattern of the exposure mask, various experiments have been tried by the inventors of the present invention.

At first, in a method which has been proposed as a, block exposure (or cell projection), it is confirmed whether a "distance less than a resolution limit" could be obtained on the exposure mask (which is also referred to as the transmission mask).

In the exposure mask described below, a wide concave portion is formed on a silicon substrate to form a thin film region, and the thin film region is used as a membrane. With taking account of mechanical strength, electron stopping capability, and the like, a thickness of the membrane is determined as a lower limit value, i.e., 20 $\mu$m.

Furthermore, within a one shot range of the electron beam, one or more non-exposed patterns, each having an island-like or peninsula-like plan shape, and their peripheral ring or U-shaped opening portions for transmitting charged particles (electron beams) are formed in the exposure mask. In addition, bridging portions (i.e., crossbeams), each has a width which is not exposed substantially on a wafer, are disposed in beam transmitting regions so as to hold the island-like or peninsula-like non-exposed patterns.

Figure 3A:
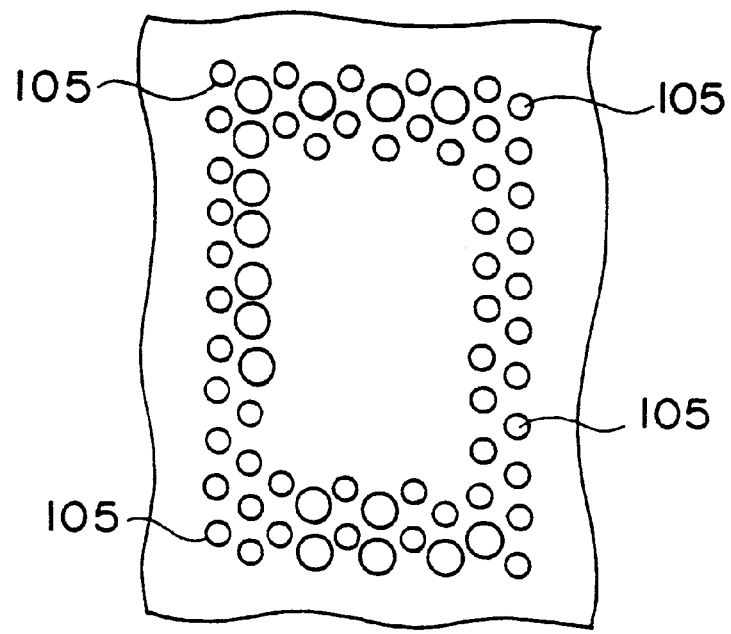
FIG. 3A is a plan view showing a pattern of the third conventional exposure mask.
Figure 3B:
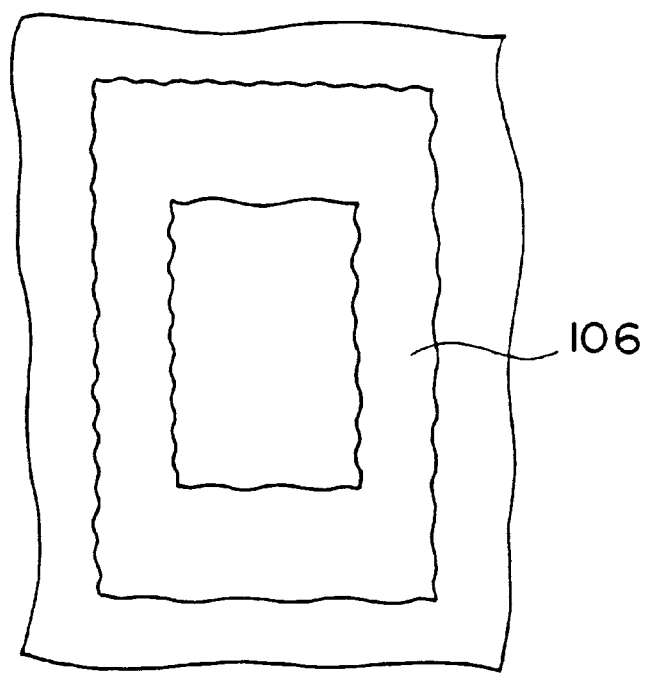
FIG. 3B is a plan view showing another pattern of the third conventional exposure mask.
Figure 4:
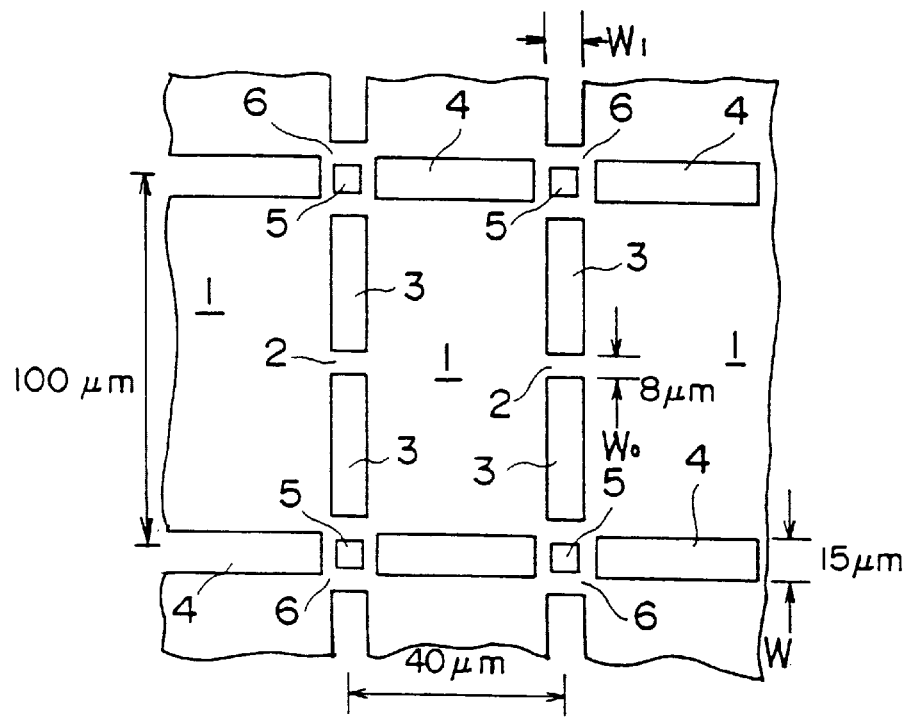
FIG. 4 is a plan view showing an aperture pattern of the first exposure mask used in an experiment according to the present invention.

(a) First Exposure Mask and Exposure Results Obtained by the First Exposure Mask As shown in FIG. 4, a pattern formed on the membrane is employed as the first exposure mask. The exposure mask has patterns which are used to form rectangular patterns successively on a positive type EB resist.

In FIG. 4, a plurality of opening regions 3, 4 are formed on division lines which divide the exposure mask into a plurality of rectangular electron beam shielding patterns 1 as island-like patterns, each having a size 40 $\mu$m×100 $\mu$m. The first two rectangular opening regions 3 each having a width (W1) of 15 $\mu$m are formed on two longer sides of the electron beam shielding patterns 1. The two opening regions 3 are separated by a bridging portion (bridging non-opening portion) 2 having a length (W0) of 8 $\mu$m. The second opening region 4 having a width (W) of 15 $\mu$m is formed on two shorter sides of the electron beam shielding patterns 1. Virtual lines, which divide the exposure mask into the electron beam shielding patterns 1 in vertical and horizontal directions, can be considered to pass on center lines of the first opening regions 3 and the second opening regions 4.

In addition, the third rectangular opening regions 5 are formed in intersecting regions wherein alignments of the first opening regions 3 intersect the alignments of the second opening regions 4. Each of the third opening regions 5 serves to separate four corners of adjacent electron beam shielding patterns 1. Each of the third opening regions 5 is separated by bridging portions 6 from the first opening regions 3 and the second opening regions 4.

Figure 5:
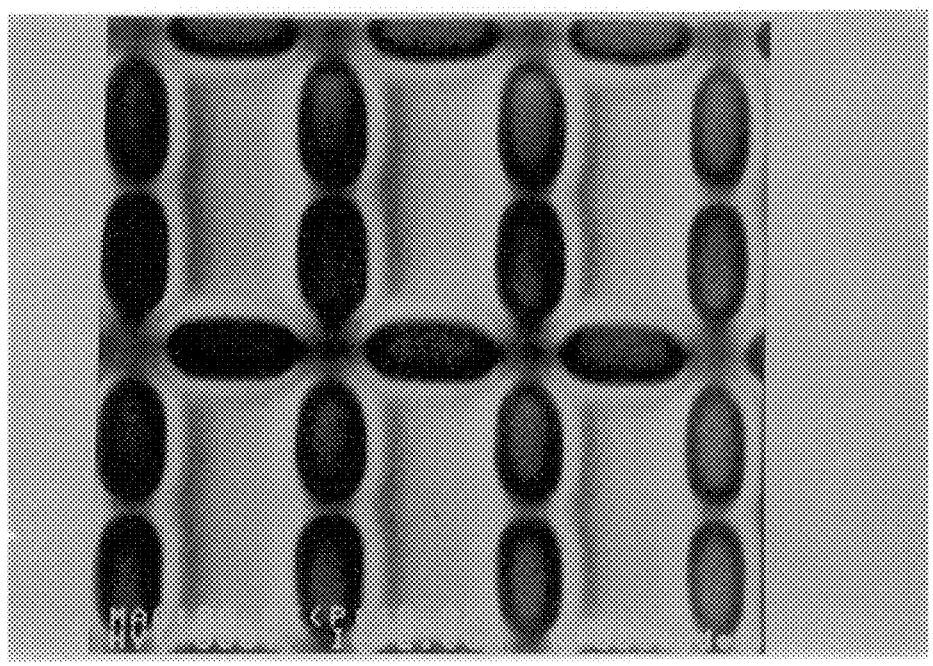
FIG. 5 is a microphotograph showing a plan view of the exposed resist pattern obtained when the exposure mask shown in FIG. 4 is employed.

When the positive type EB resist is exposed by the electron beams by employing the exposure mask formed above, a positive type EB resist pattern shown in the microphotograph of FIG. 5 can be derived. As a result, it has been found that the patterns corresponding to the bridging portions 2 each having a length of 8 $\mu$m are resolved on the EB resist even by the electron beams.

Since a pattern magnification of the exposure mask is set to 100 times, the lengths W0 of the bridging portions 2 and 6, each respectively separating the first copening regions 3 from each other and separating the third opening regions 5 from the first and second opening regions 3 and 4, become 8 µm on the exposure mask and become 0.08 µm on the EB resist.

Now, the length W0 of the bridging portion (frame) is defined as a length of the bridging portion in the direction along the edge line of the electron beam shielding patterns 1 (i.e., the alignment direction of the opening portion). The width W1 of the opening region is also defined as a length of the opening region in the direction perpendicular to the edge line of the electron beam shielding patterns 1 (i.e., the alignment direction of the opening region). The above definitions can also be suitable for following explanations.

Figure 6:
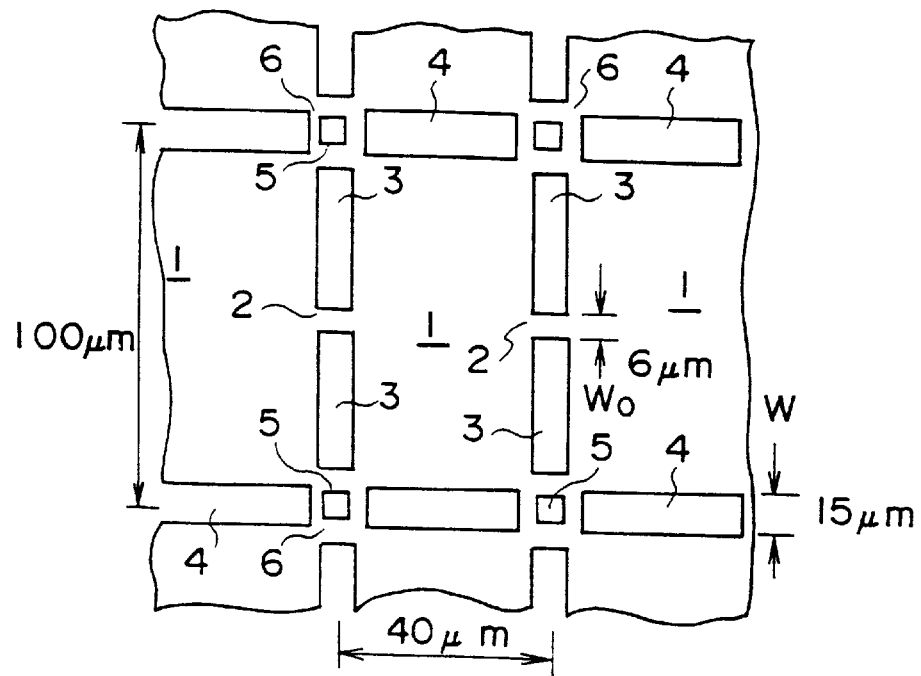
FIG. 6 is a plan view showing an aperture pattern of the second exposure mask used in the experiment according to the present invention.

(b) Second Exposure Mask and Exposure Results Obtained by the Second Exposure Mask FIG. 6 shows part of a pattern of the second exposure mask. The second exposure mask has the same pattern configuration as that of the first exposure mask, except that lengths Wo of bridging portions 2 and 6, each respectively separating the first opening regions 3 from each other and separating the third opening regions 5 from the first and second opening regions 3 and 4, are formed as 6 µm.

Figure 7:
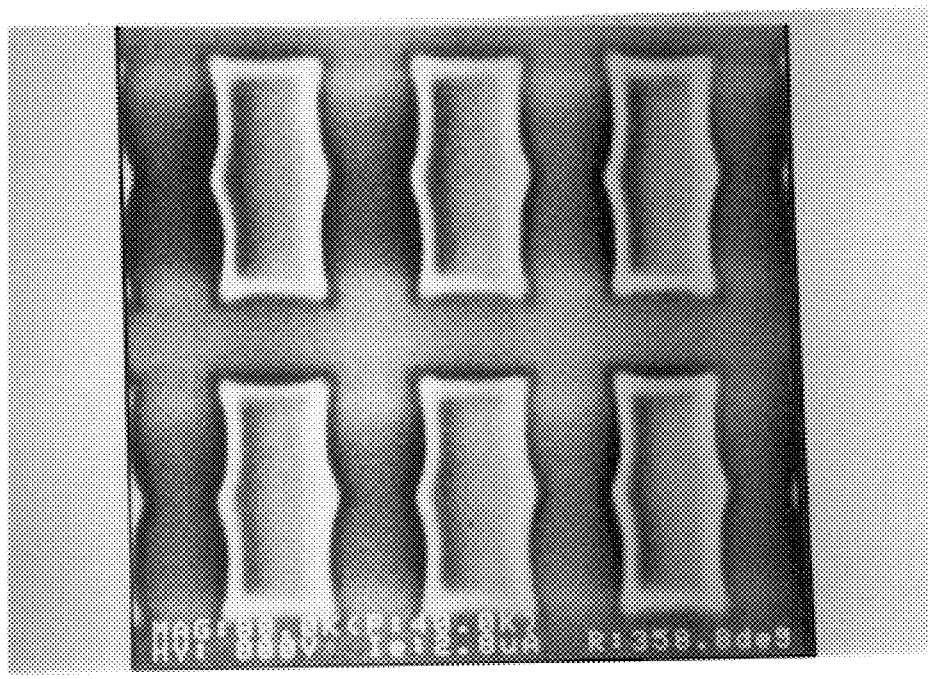
FIG. 7 is a microphotograph showing a plan view of the exposed resist pattern obtained when the exposure mask shown in FIG. 6 is employed.

While supplying an exposure amount slightly larger than the optimal exposure amount to the positive-type EB resist, a positive type EB resist pattern shown in FIG. 7 can be derived when the resist is over-exposed by the electron beams with employing the second exposure mask.

In this second exposure mask, it has been confirmed that, unlike the first exposure mask, the patterns corresponding to the bridging portions 2 and 6 are not resolved, but their traces still remain on the EB resist patterns. In consequence, it has been found that, if the lengths Wo of the bridging portions 2 and 6 are narrowed to about 6 µm, they are not resolved on the positive type EB resist.

Figure 8:
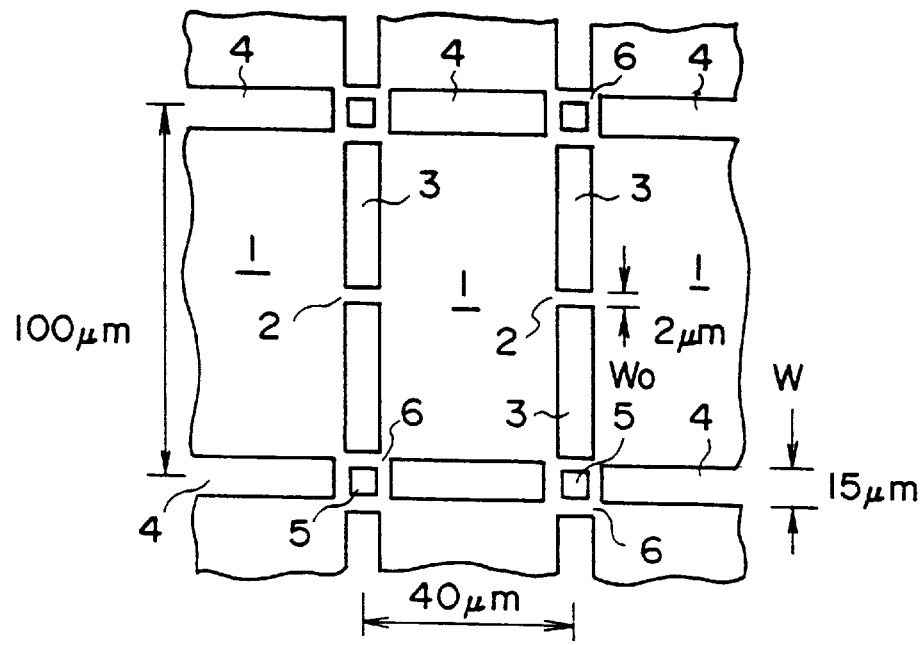
FIG. 8 is a plan view showing an aperture pattern of the first exposure mask according to the first embodiment of the present invention.

(c) Third Exposure Mask and Exposure Results Obtained by the Third Exposure Mask FIG. 8 shows part of a pattern of the third exposure mask. The third exposure mask has the same pattern configuration as that of the first exposure mask, except that lengths Wo of bridging portions 2 and 6, each respectively separating the first opening regions 3 from each other and separating the third opening regions 5 from the first and second opening regions 3 and 4, are formed as 2 µm.

Figure 9:
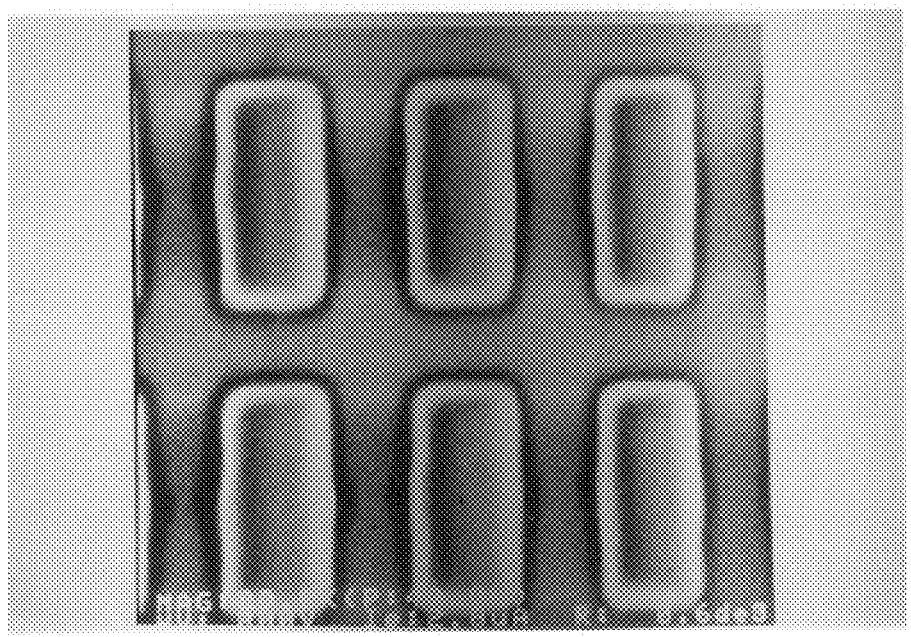
FIG. 9 is a microphotograph showing a plan view of the exposed resist pattern obtained when the exposure mask shown in FIG. 8 is employed.

While providing an exposure amount slightly larger than the optimal exposure amount to the positive type EB resist, a positive type EB resist pattern shown in FIG. 9 can be derived when the resist is over-exposed by the electron beams with employing the third exposure mask.

According to the third exposure mask, not only the patterns corresponding to the bridging portions 2 have not been resolved, but also their traces have not been found. Thus linear stripe-like clearances are formed around the pattern corresponding to the electron beam shielding pattern 1, due to the proximity effect caused by the electron beams, described later.

Figure 10:
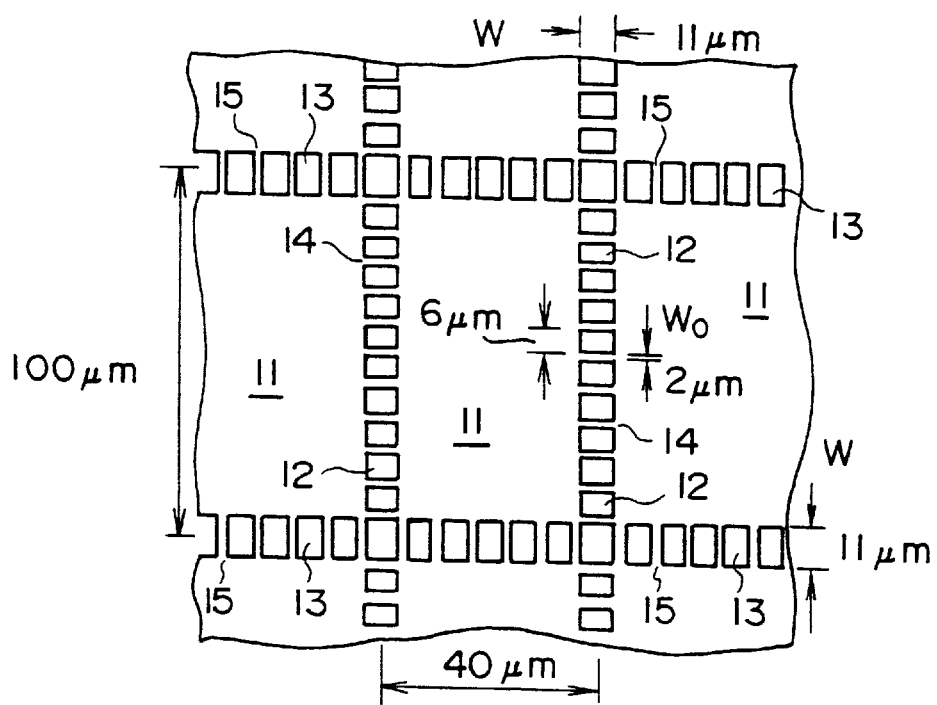
FIG. 10 is a plan view showing an aperture pattern of the second exposure mask according to the first embodiment of the present invention.

(d) Fourth Exposure Mask and Exposure Results Obtained by the Fourth Exposure Mask As shown in FIG. 10, a pattern formed on the membrane is used as the fourth exposure mask.

As in the first to third exposure masks, the fourth exposure mask has patterns which are used to form rectangular patterns on the positive-type EB resist.

In FIG. 10, a plurality of opening regions 12, 13 are formed on virtual lines which divide the exposure mask into a plurality of rectangular electron beam shielding patterns 11 as island pattern regions, each having a size of 40 µm×100 µm. A plurality of the first rectangular opening regions 12, which are separated via bridging portions (crossbeams) 14 from each other, are formed on longer sides of the electron beam shielding patterns 11. A plurality of the second opening regions 13, which are separated via a bridging portion 15 from each other, are formed on shorter sides of the electron beam shielding patterns 11. The sides of the first opening region 12 and the second opening region 13 in the direction along the edge lines of the electron beam shielding patterns 11 are 6 µm in length. Also the sides of the first opening region 12 and the second opening region 13 in the direction perpendicular to the edge lines of the electron beam shielding patterns 11 are 11 µm in length. All the distances between the first opening regions 12, the distances between the second opening regions 13, that is, the lengths Wo of the bridging portions 14, 15 are set to 2 µm.

Virtual lines dividing the exposure mask into the electron beam shielding patterns 11 can be considered to pass on center lines of the first opening regions 12 and the second opening regions 13.

In this case, the pattern magnification of the exposure mask is set to 100 times. Widths of the first opening regions 12 and the second opening regions 13 which are formed to surround the electron beam shielding patterns 11 are 11 µm on the exposure mask and are about 0.11 µm on the EB resist.

Figure 11:
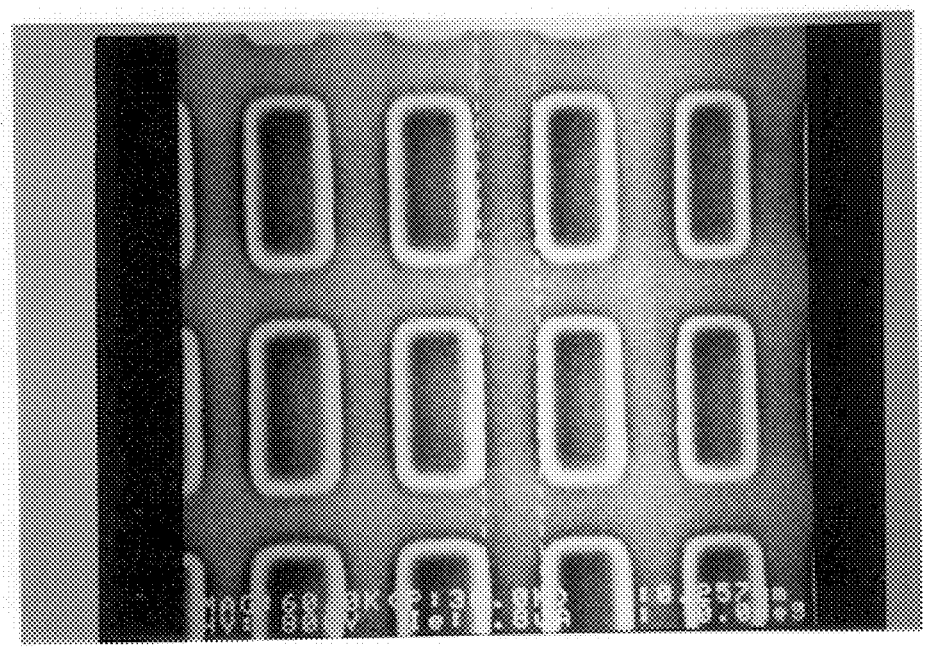
FIG. 11 is a microphotograph showing a plan view of the exposed resist pattern obtained when the exposure mask shown in FIG. 10 is employed.

FIG. 11 is a microphotograph showing a pattern of the EB resist wherein it is over-exposed by 90 µC/cm² which corresponds to about 30% over-exposure.

In this case, the lengths of the bridging portions 14, 15 become about 0.02 µm on the EB resist formed on the wafer. However, even if the over-exposure is effected by about 20%, the bridging portions 14, 15 have not been resolved. As a result, the resist could be removed in straight stripe fashion from the edge lines of the rectangular patterns corresponding to the electron beam shielding patterns 11.

In the fourth mask, in contrast to the first to the third masks, a large number of the first opening regions 12 and the second opening regions 13, both having short sides, are formed. Therefore, it has been confirmed experimentally that a linearity of edge lines of the rectangular patterns corresponding to the electron beam shielding patterns 11 on the EB resist can be improved.

Figure 12:
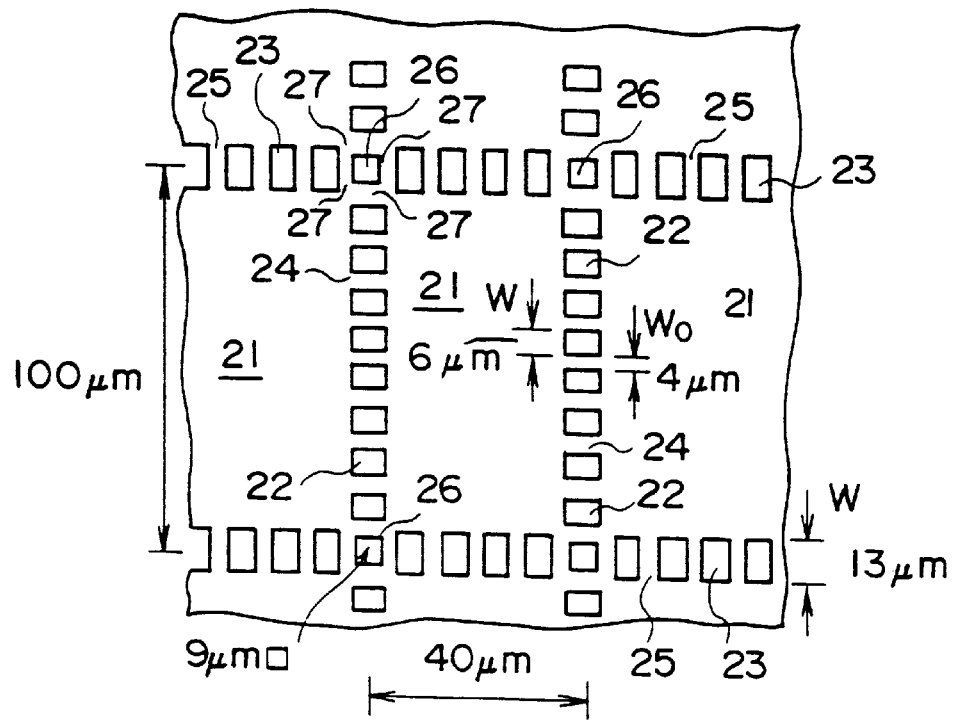
FIG. 12 is a plane view showing an aperture pattern of the third exposure mask according to the first embodiment of the present invention.

(e) Fifth Exposure Mask and Exposure Results Obtained by the Fifth Exposure Mask As shown in FIG. 12, a pattern formed on the membrane is used as the fifth exposure mask. Employing the fifth exposure mask, rectangular patterns are formed on the positive type EB resist.

In FIG. 12, a plurality of opening regions 22, 23 are formed on virtual lines which divide the exposure mask into a plurality of rectangular electron beam shielding patterns 21 as island-like patterns, each having a size 40 µm×100 µm. A plurality of the first rectangular opening regions 22, which are separated via bridging portions (bridge-like non-opened portions) 24 from each other, are formed on longer sides of the electron beam shielding patterns 21. A plurality of the second opening regions 23, which are separated via bridging portions 25 from each other, are formed on shorter sides of the electron beam shielding patterns 21.

The sides of the first opening region 22 and the second opening region 23 in the direction along the edge lines of the electron beam shielding patterns 21 are 6 µm in length. Also the sides of the first opening region 22 and the second opening region 23 in the direction perpendicular to the edge lines of the electron beam shielding patterns 21 are 13 µm in length. All the distances between the first opening regions 22, the distances between the second opening regions 23, that is, the lengths Wo of the bridging portions 24, 25 are set to 4 μm.

Virtual lines, which divide the exposure mask into the electron beam shielding patterns 21, can be considered to pass on center lines of the first opening regions 22 and the second opening regions 23.

In addition, the third rectangular (square) opening regions 26 are disposed in intersecting regions wherein alignments of the first opening regions 22 intersect the alignments of the second opening regions 23. Each side of the third opening regions 26 is set to 9 μm in length which is smaller than widths of the first opening regions 22 and the second opening regions 23.

Figure 13:
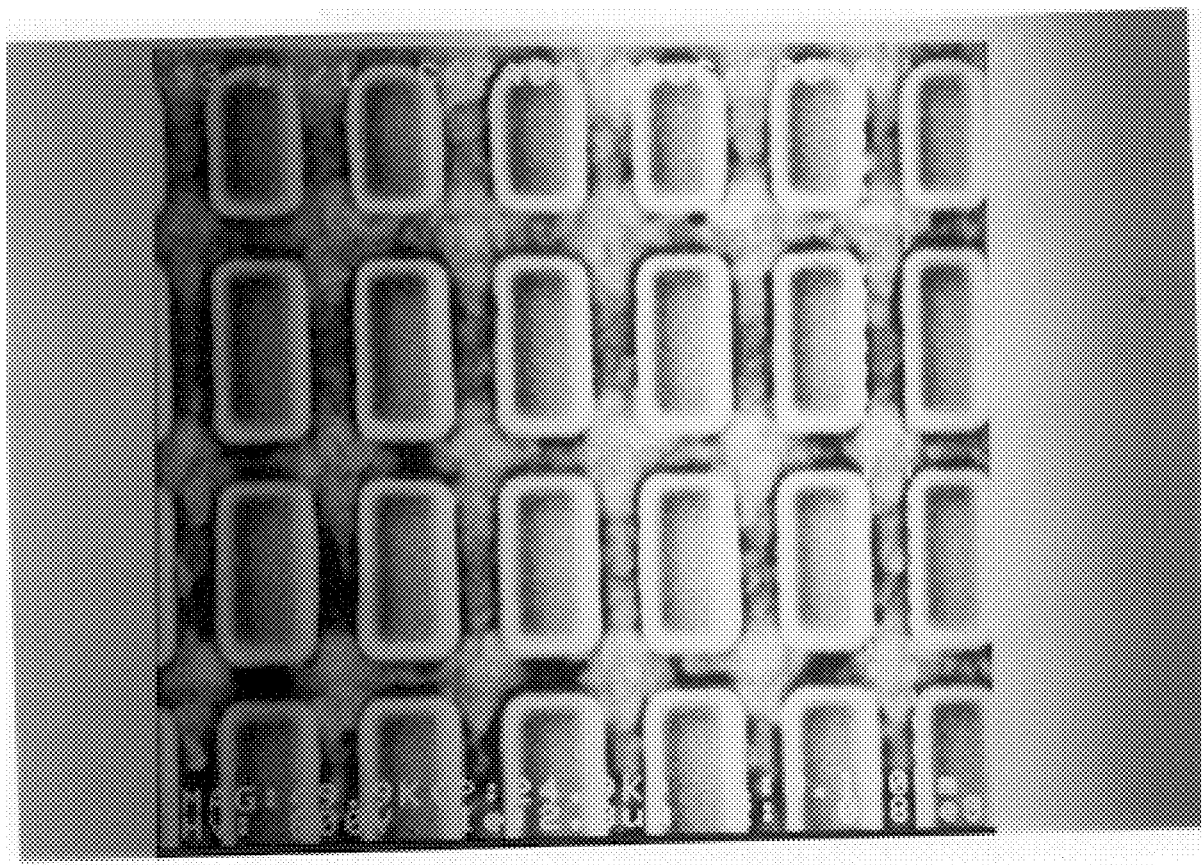
FIG. 13 is a microphotograph showing a plan view of the exposed resist pattern obtained when the exposure mask shown in FIG. 12 is employed.

At that time, even if the over-exposure is made by about 15%, the bridging portions 24, 25 have not been resolved. FIG. 13 is a microphotograph showing a pattern of the EB resist wherein it is patterned by over-exposing of 80 μC/cm² which corresponds to about 20% over-exposure, employing the fifth exposure mask. The portions corresponding to the bridging portions 24, 25 have not been resolved on the resist, so that good rectangular patterns having shapes corresponding to the electron beam shielding patterns 21 could be derived.

In the meanwhile, since bridging portions 27 are formed around the third opening regions 26 by disposing the third opening regions 26 in the intersecting regions, mechanical strength of the intersecting regions in the exposure mask can be increased.

If cross-shaped opening patterns are formed instead of the bridging portions 27 in the intersecting regions, corners of the rectangular patterns are extremely rounded off due to the proximity effect caused by the electron beams. However, in the fifth exposure mask, since the bridging portion 27 serves to reduce an exposure amount in the intersecting regions, the rounding off of the corners of the patterns can be suppressed. This is apparent from the exposure result shown in FIG. 13, for example.

This fact is true of the first to fourth exposure masks. However, if few opening regions are disposed around the electron beam shielding patterns 21, i.e., if the opening regions are set to be long, central portions of the opening regions are bulged, as shown in FIGS. 5 and 7. In addition, the more the lengths of the opening regions are shortened, i.e., the more the number of the bridging portions are increased, the more the linearity of the pattern edges on the EB resist can be improved, as shown in FIGS. 11 and 13.

Various conclusions are derived from the above experimental results as stated in the following.

Since the bridging portions of the exposure mask must not be resolved by the EB exposure on the positive type EB resist which is formed on the wafer, the widths of the bridging portions cannot be set too large without any restriction. In this case, the more the bridging portions are arranged narrowly, the more the thermal and mechanical strengths can be increased. On the contrary, if the bridging portions are formed too much in number, the gross area of the shielding patterns is increased, so that the exposure amount becomes insufficient on the resist.

According to the experiments performed by the present inventors, it has been found that the ratio (W/Wo) of lengths W of the opening regions against the lengths Wo of the bridging portions must be required 1.5 times or more at the lowest. For instance, if the length Wo of the bridging portion is set to 4 μm, the length W of the beam transmitting region (the length of the opening region) is required 6 μm or more. In other words, the pitch of the bridging portions must be set to be 2.5 times or more as large as the length W.

Accordingly, the electron beam exposure mask where the length W of the beam transmitting region is set to be longer 1.5 times or more than the length Wo of the bridging portion within an exposed range, or the electron beam exposure mask where the pitch of the bridging portion is set to be longer 2.5 times or more than the width of the bridging portion is needed.

Figure 14:
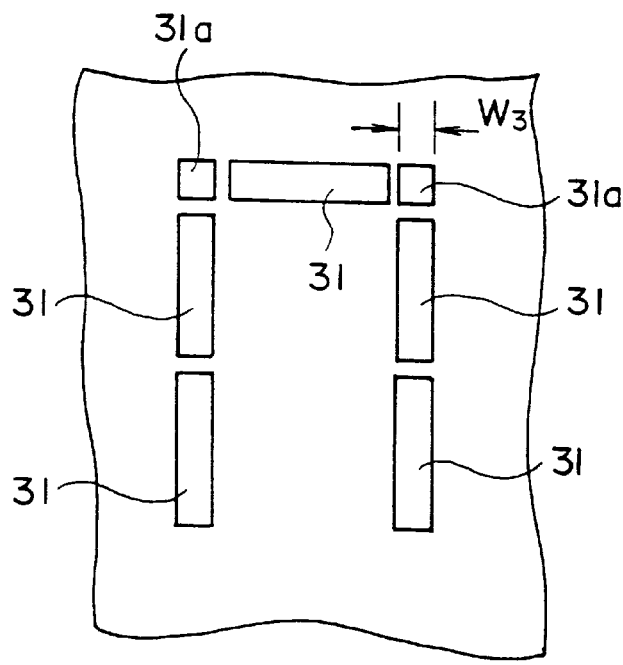
FIG. 14 is a plan view showing an aperture pattern of the fourth exposure mask according to the first embodiment of the present invention.

Although the case where the island-like patterns are formed on the exposure mask has been explained as above, an example of the patterns of the exposure mask which is employed to form the peninsula-like patterns on the EB resist is shown in FIG. 14. In this example, good exposure as described above can also be attained if the a plurality of opening regions 31 are disposed along the U-shaped pattern. Note that, in this case, since the opening region 31a arranged on the corners of the U-shaped pattern has small swell due to the proximity effect, it may be formed in the same width W3 as that of other opening regions 31. Patterns in the exposure mask described above can be formed on the resist by one electron beam shot.

Figure 15:
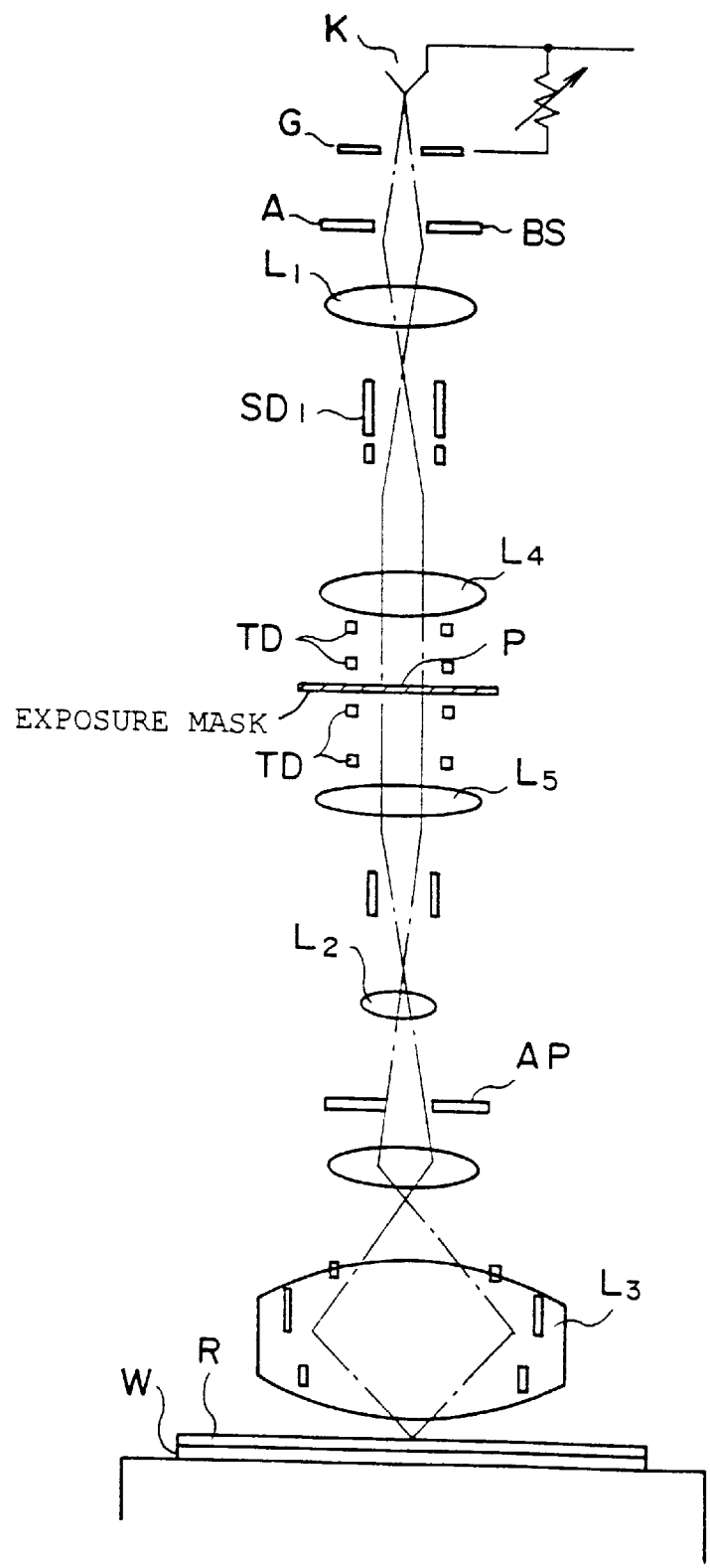
FIG. 15 is a view schematically illustrating a configuration of an example of an exposure apparatus in which the exposure masks of the present invention are employed.

(2) Relationship Between a Pattern Width of the Exposure Mask According to the First Embodiment of the Present Invention and the Proximity Effect The exposure masks described above are employed when the resist is exposed by means of the having a structure shown in FIG. 15. In the electron beam exposure apparatus, the electron beam (charged particles beam) is emitted from a cathode electrode K, and is passed through a grid G, an anode A, a beam shaping slit BS1, a focusing lens L1, a slit deflector for deflecting a beam location, a second lens L4, and the exposure mask, and is then patterned.

Then, the electron beam is passed via lenses L2 and L3, an aperture AP etc. and is then irradiated on the EB resist R formed on the surface of a wafer W to thus form a latent image thereon. In FIG. 15, a reference TD denotes a deflector which deflects the electron beam to select patterns on the exposure mask.

After completing the exposure as described above, the patterns are formed as visible images by developing the EB resist as described above.

In the meanwhile, in order to eliminate the pattern of the bridging portions of the exposure mask, it is requested that the bridging portions are not resolved because of the proximity effect caused by the electron beams which transmit near the opening regions (beam transmitting regions) around the bridging portions. In other words, the bridging portions of the exposure mask does not appear as the patterns because of not the diffraction wave effect but the proximity effect of the exposure mask at the time of resist development.

The proximity effect is defined as that exposure regions on the resist are spread by scattering of the charged particles when they are irradiated on the resist. The scattering is classified into a forward scattering and a backward scattering. The former is denoted as that the charged particles irradiated onto the resist scatters within the resist. The latter is denoted as that charged particles, which enter into the wafer via the resist, scatters by rebounding on the wafer or springing back.

Figure 16:
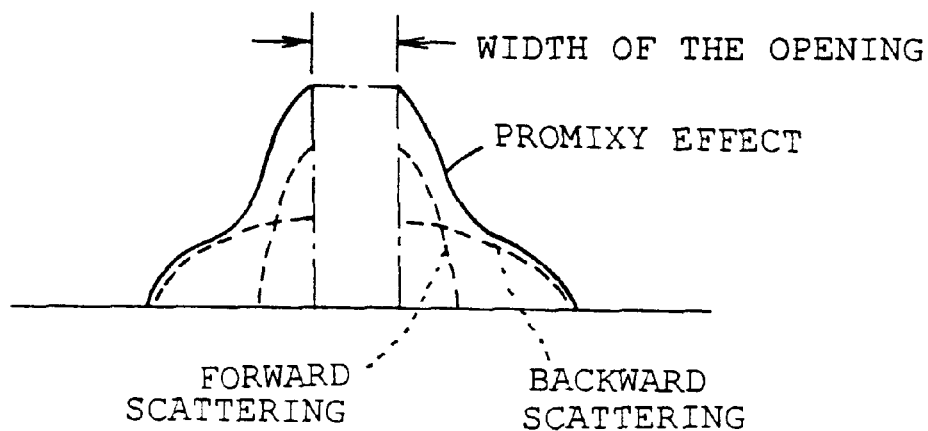
FIG. 16 is a diagram showing a distribution of exposure amount to illustrate a proximity effect caused by electron beams in the present invention.
Figure 17:
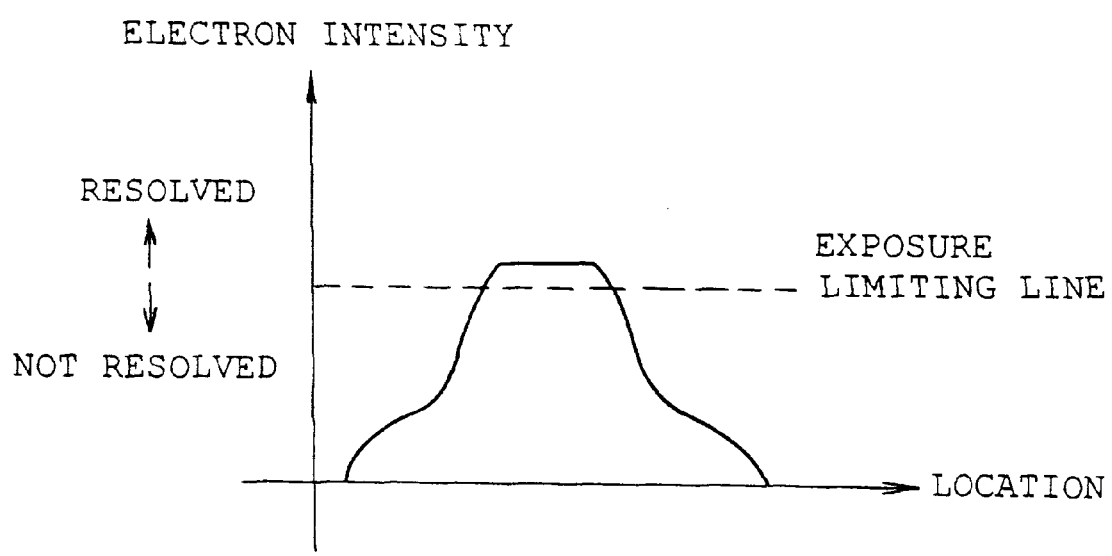
FIG. 17 is a view showing an exposure limit if the proximity effect is taken into consideration.

Depending upon the accelerating voltage of the electron beam etc., a range affected by the proximity effect is determined. A range of about 0.01 to 0.1 μm is influenced by the forward scattering, and a range of about 3 to 5 μm is influenced by the backward scattering. Since the forward and backward scatterings have Gaussian distribution commonly, the factor which the resist actually receives, i.e., the factor of decreasing a resolution ability of the electron beam is given as a sum of the forward scattering and the backward scattering, as shown in FIG. 16. However, as shown in FIG. 17, depending that an amount of exposure is excess of a boundary value (also called a thresholds value), it is determined whether or not the pattern is resolved on the resist. Therefore, edge portions of the pattern are determined according to the level of the boundary value. If the amount of exposure exceeds the boundary value, the pattern is resolved.

Figure 18:
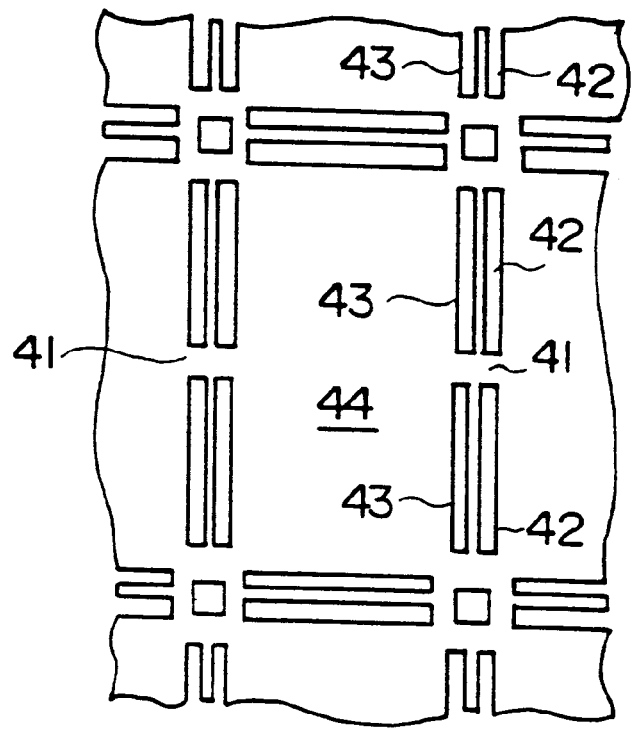
FIG. 18 is a plan view of an exposure mask used for determining various conditions of forming patterns of the exposure masks according to the first embodiment of the present invention.

In general, if the opening patterns for transmitting the charged particles are disposed closely more and more in the exposure mask, overlapping of the charged particles (exposure amount) caused by their proximity effects tends to form their united opening patterns on the resist. For example, as shown in FIG. 18, if the resist is exposed by using the exposure mask where opening regions 42, 43, both spaced apart by a distance of 4 $\mu$m, are disposed around a rectangular electron beam shielding pattern 44 via bridging portions 41 in a double line, a united pattern of two opening regions 42, 43 are formed on the resist due to the proximity effect, although not shown. However, if two opening regions 42, 43 are formed in a double line as above, the proximity effect caused by the right side opening region 42 affects the left side region of the left side opening region 43, for example, to result in spread pattern widths on the resist. In consequence, such double line arrangement is not preferable for the exposure mask since the dimensional accuracy is degraded.

Therefore, if, as described, the proximity effect is taken into account, such a condition is required that, when the island-like or peninsula-like patterns are surrounded by a plurality of opening regions, the opening regions must not be arranged in parallel.

Figure 19:
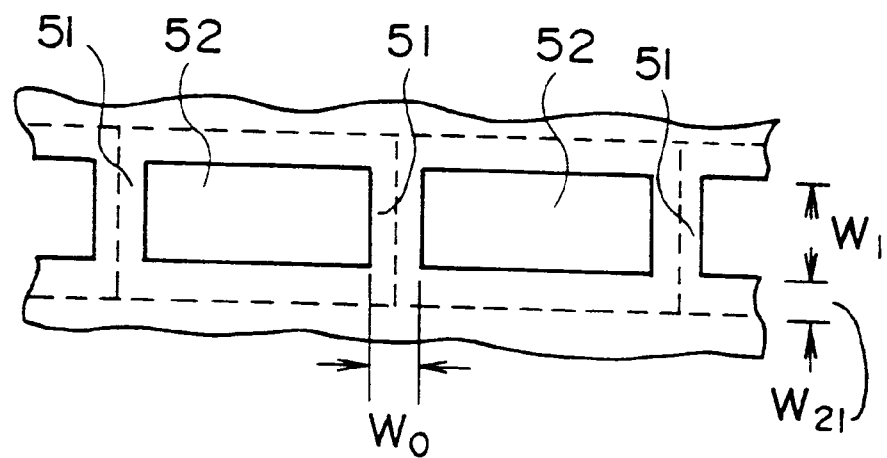
FIG. 19 is a plan view showing a relation between a width of a crossbeam and a bulge of the pattern of the exposure masks according to the first embodiment of the present invention.

In the meanwhile, as shown in FIG. 19, a length Wo of the bridging portion 51 of the exposure mask is so determined that the bridging portion 51 is not resolved on the resist because of the proximity effect. Since the proximity effect affects the region of the opening region 52 where the bridging portion 51 is not formed, a bulge, (shift component) W21 of the width of the pattern of the opening region 52 is caused on the EB resist. Besides, the exposure amount tends to be increased in the bridging portion 51 of the exposure mask, because of a synergetic effect of the proximity effect caused by two opening regions 52 disposed in both sides of the bridging portion 51. Accordingly, if the length of the bridging portion 51 is set slightly longer than two times of the bulge W21 of the opening region 52, the bridging portion 51 is not resolved on the resist, and therefore it does not appear as the pattern on the resist.

For instance, if the bulge W21 of the opening region 52 caused by the proximity effect on the EB resist and the width of the pattern to be exposed is set to 0.15 $\mu$m, the width W1 of the opening region 52 may be set 0.11 $\mu$m by adding the bulges of both sides of the opening region 52. In this case, when the length Wo of the bridging portion 51 is set to 0.04 $\mu$m, the bridging portion 51 does not appear as the pattern on the resist.

The resist has been exposed indeed by the exposure mask fabricated based on the analysis above. When the width of the pattern, which corresponds to the opening region 52 located in the region irradiated by the charged particles, becomes 0.15 $\mu$m, the pattern of the bridging portion 51 is not eliminated and still remains on the resist. Furthermore, when the exposure amount is increased so as not to resolve the bridging portion 51, the pattern width W1 of the opening region 52 becomes 0.20 $\mu$m to thus cause an actual bulge larger by 0.05 $\mu$m than an estimated bulge.

Thereby, it has been found that it is difficult to determine the pattern width of the opening region only by the analysis.

Therefore, the bulge W21 of the pattern is detected in advance to collect data when the pattern of the bridging portion 51 disappears. The width W1 of the opening region (beam transmitting hole) 52 must be set to be smaller (offset) than a width based on the data. For instance, the bulge W21 of the opening region 52 is set larger than the length Wo of the bridging portion 51 as an offset amount.

(3) Shape of Four Corners of the Electron Beam Shielding Region in the Exposure Mask of the Embodiment of the Present Invention As has been described advance, if a plurality of opening regions are disposed in two directions (e.g., vertical and horizontal directions), the opening region, if located in the intersecting region of two directions and formed as a cross shape, causes the proximity effect more than other portions. Thus an over-exposure is produced, and the corner portion of the rectangular region which is surrounded by a plurality of opening regions is formed as a round portion. On the other hand, if no transmitting hole is provided in the intersecting region (or if the transmitting hole is too small), acute angle corner portions shown in FIG. 5 are formed in the resist pattern of adjacent rectangular region. Thus it becomes difficult to form desired patterns. As a result, a hole having a suitable size for transmitting the electron beam must be formed indispensably in the central portion of the intersecting region.

In case three or more adjacent island-like patterns are disposed in the exposure mask, beam transmitting holes shown in FIG. 10 or FIG. 12 must be formed in the center of the intersecting region where non-transmitting holes are adjoined each other in the exposure mask.

(4) Area of the Opening Regions by One Shot Employing the Exposure Mask of the Embodiment of the Present Invention In case the exposure is performed in fact by using the exposure mask, the exposure amount is slightly increased on the ordinary exposure region. Although the bridging portion is eliminated by the proximity effect on the EB resist, influences of the proximity effects vary unless areas of the opening regions except for the above intersecting regions are fixed constantly. Consequently, particular portions of the resist are over-exposed, or dimensional accuracy cannot be assured in the whole, so that intended patterns are not derived.

Thus, in the patterns of the exposure mask, each of opening regions (beam passing regions) corresponding to exposed regions on the resist, i.e., respective opening region formed between the bridging portions, must be formed to have substantially the same opening area in a region irradiated by the electron beam at a time (one electron beam shot range).

In addition, in the patterns of the exposure mask, the width of each of the bridging portions corresponding to the non-exposed portions on the resist (beam shaded portion) must be formed to have substantially the same length Wo in one electron beam shot range.

The second embodiment of the present invention will be described with reference to FIGS. 20 to 31 hereinbelow.

Figure 20:
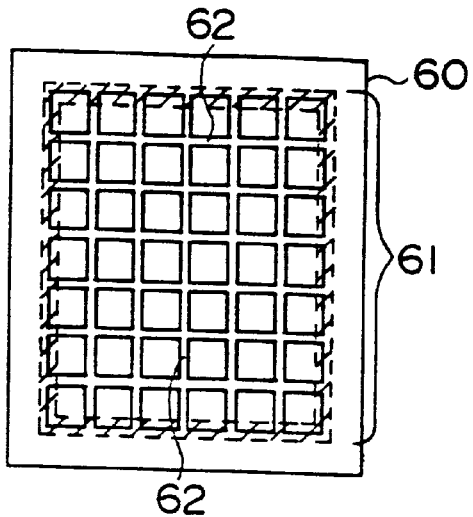
FIG. 20 is a plan view showing the first example of exposure masks used for an electron beam exposure method according to the second embodiment of the present invention and an auxiliary exposure region thereof.

(1) In the exposure mask (also referred to as the block mask) of the first embodiment described above, the island-like or peninsula-like patterns are prevented from being come out from the exposure mask, by dividing the opening region surrounding the patterns by a plurality of crossbeams (electron beam shielding region). A technique for dividing the opening region by the crossbeams can be employed inside of one rectangular opening pattern 61 formed in the exposure mask 60, as shown in FIG. 20, as well as the above opening regions around the island-like or peninsula-like patterns. In other words, when an amount of the electron beam passing through the opening regions 61 formed at a predetermined location becomes too much, it becomes possible to reduce the exposure amount (current amount of the electron beam) passing therein by dividing the inside of the opening patterns 61 into plural regions. In this case, the width of the crossbeam 62 must be formed so small not to be resolved on the resist, as in the first embodiment.

Figure 21:
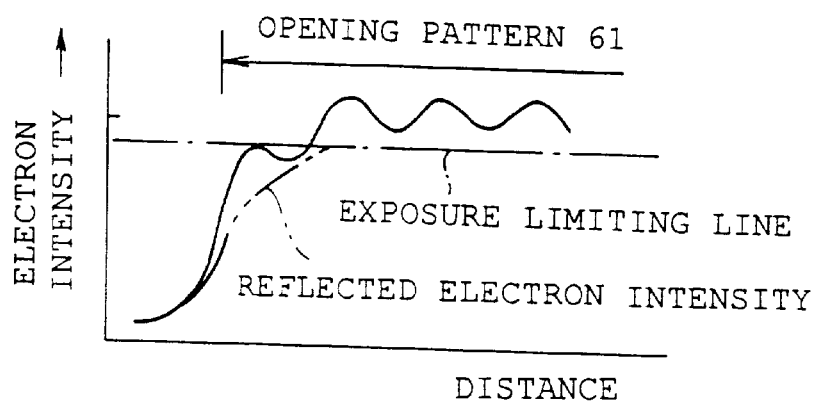
FIG. 21 is a view showing a distribution of electron intensity on the resist when an auxiliary exposure is not effected.

The charged particles (or electron intensity) passing through the same opening pattern 61 and irradiated on the resist (not shown) have sometimes different distributions on the resist because of the proximity effect. Namely, as shown in FIG. 21, an amount of the charged particles is reduced in edges and their periphery of the opening regions 61 in contrast to other regions. This is because few charged particles enter from the outside of the opening regions 61 by proximity effect.

As shown in FIG. 21, in case the electron intensity passing through an area near the edge of the opening regions 61 does not become larger than the resolving boundary value shown in FIG. 21, narrow patterns are formed on the resist.

Therefore, in the second embodiment, the electron intensity on the resist is corrected by irradiating the electron beam partially in the resist region (region encircled by the broken line in FIG. 20) which corresponds to the edges and their periphery of the opening regions 61. Such partial irradiation of the electron beam is denoted as auxiliary exposure or inclined auxiliary exposure hereinafter. The auxiliary exposure is effected before or after the entire exposure of the opening pattern.

Figure 22:
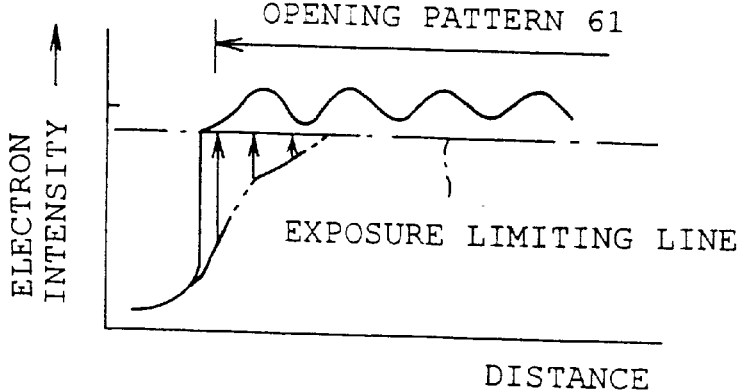
FIG. 22 is a view showing a distribution of electron intensity on the resist when an auxiliary exposure is effected.

According to the auxiliary exposure, as shown in FIG. 22, the charged particles can be increased partially and adequately in the region of the edges of the opening regions 61 and their periphery. Thereby, the opening pattern 61 can be transferred onto the resist as a latent image (not shown) with high accuracy.

Unless the inside of the opening regions 61 of the exposure mask is divided by the crossbeams 62, the inclined auxiliary exposure is needed. This is because the distribution of the charged particles becomes small in the region of the edges of the opening regions 61 and their periphery even when the crossbeams 62 are not formed in the opening regions 61.

Thus, in case the exposure mask having opening patterns without crossbeams therein is employed, the auxiliary exposure will be explained with reference to examples in detail hereinbelow.

Figure 23:
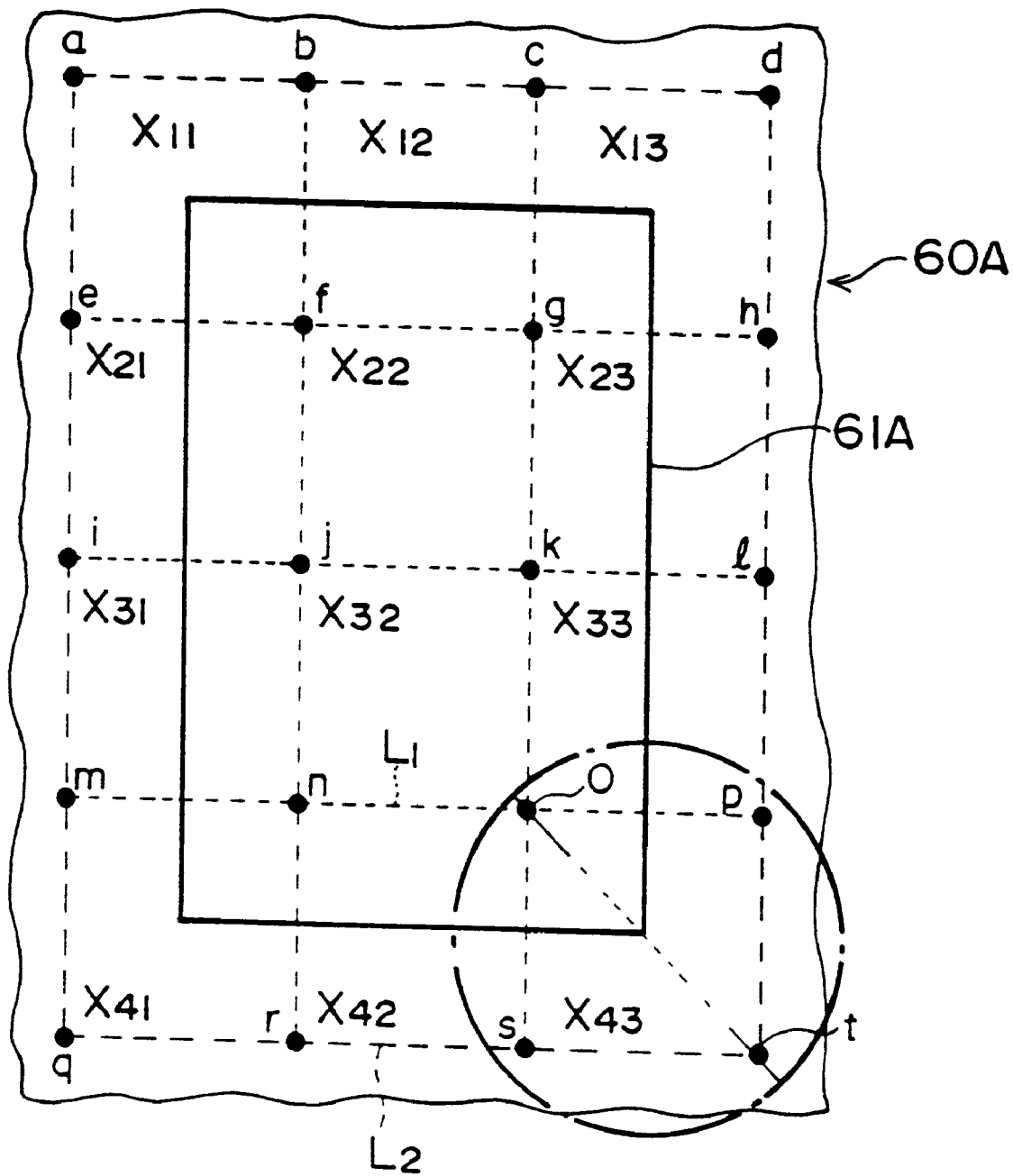
FIG. 23 is a plan view showing a situation where the second exposure mask used for the electron beam exposure method according to the second embodiment of the present invention is divided into a plurality of rectangular regions by virtual lines.

(2) FIG. 23 shows a rectangular opening pattern 61A formed in the exposure mask which is formed of a silicon plate. The opening pattern has a size of Kx×Ly.

Such opening pattern 61A is exposed by one electron beam shot. But, in order to form the patterns with high accuracy, there exists some cases where the auxiliary exposure as above is required. A method of forming the exposure mask used for the auxiliary exposure will be described hereinafter as shown in FIGS. 23 to 28 and FIG. 42.

First, as shown by the broken line in FIG. 23, the opening pattern 61A and its peripheral region is divided into a plurality of regions X11 to X43 by lattice-like virtual lines. Note that the virtual lines may be drawn either to overlap the edge of the opening pattern 61A or not to overlap the same. One divided region is formed as a rectangular block, and black round marks a to t indicate four vertexes of the rectangular blocks. At least three vertexes of the rectangular blocks are overlapped vertexes of adjacent rectangular blocks. It is of course that the rectangular block is smaller than Kx×Ly.

Figure 24:
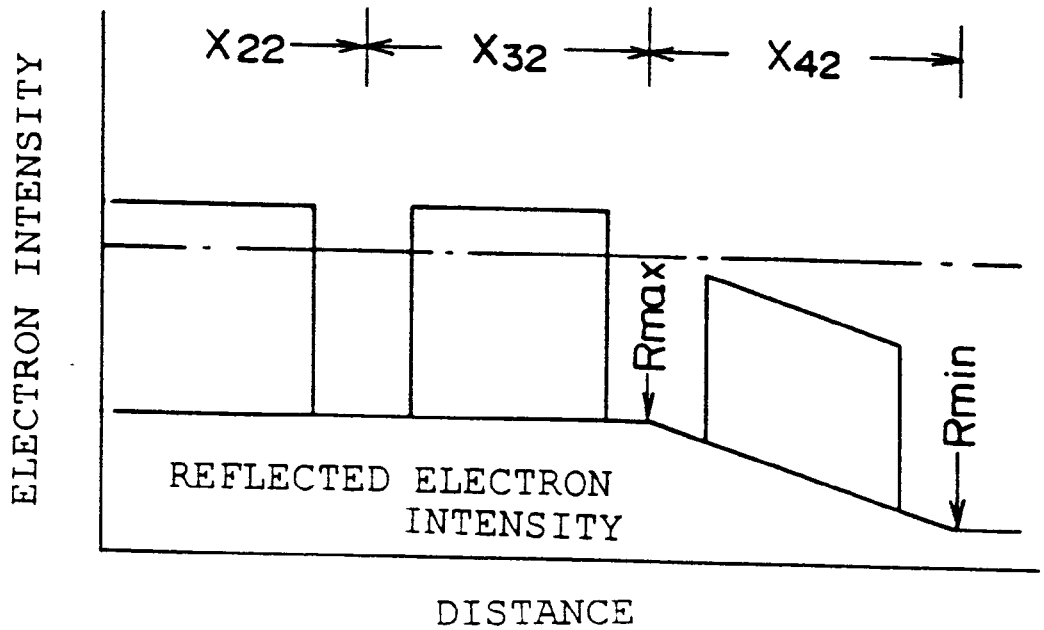
FIG. 24 is a view showing a distribution of electron intensity on the resist when exposed by employing the exposure mask in FIG. 23.
Figure 25:
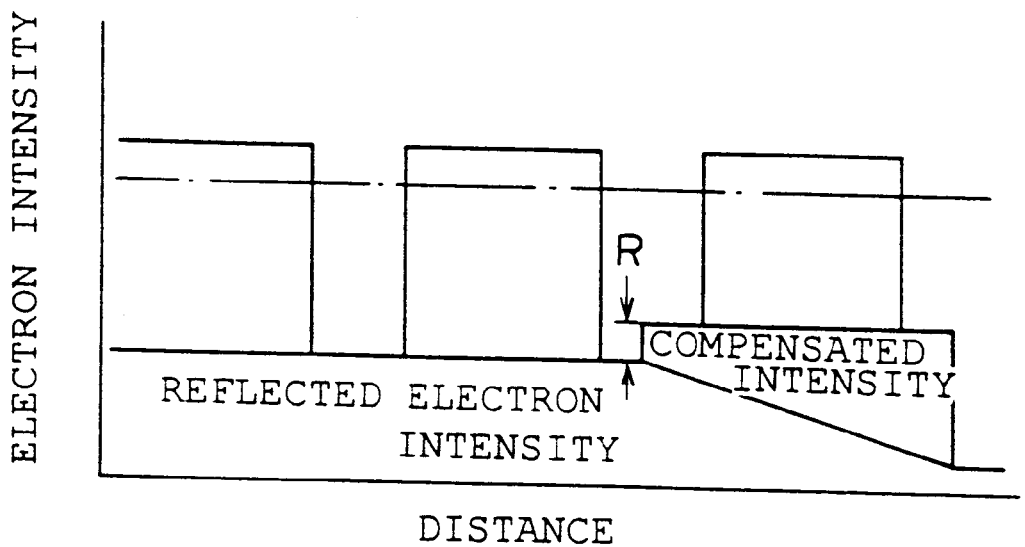
FIG. 25 is a view showing a distribution of electron intensity on the resist when the auxiliary exposure shown in FIG. 24 is effected.

After the edges of the opening regions 61A and their periphery are divided into rectangular blocks, reflected electron intensities are calculated on all vertexes a to t. Reflected electron intensities caused by the proximity effect are shown in FIG. 24, for example. In FIGS. 24 and 25, the reflected electron intensities in three regions X22, X23 and X42 divided as shown in FIG. 23 and the electron intensity of the electron beam irradiated in the center among their regions are illustrated.

According to the result of such calculation as shown in FIG. 24, it can be seen that the reflected electron intensity become smaller toward the outside of near the edge portion of the opening pattern 61A.

After the reflected electron intensities on all vertexes are calculated, changes of reduction of the reflected electron intensities are calculated in every rectangular block.

At first, it is determined whether, in divided regions (rectangular block regions) X11 to X43, the reflected electron intensities are classified into 2 types or 3 types or more.

The 2 types of classification denotes that the reflected electron intensities on four vertexes of one rectangular region are divided into 2 electron intensity types. In this case, only a case where two lines connecting vertexes having the same reflected electron intensity (for example, L1 and L2 in the region X42) becomes parallel is considered. In other cases, patterns for the auxiliary exposure are not formed. A slant A of reflected electron intensity is calculated between two vertexes having different reflected electron intensities in the direction perpendicular to the above two lines. A rate of change of the reflected electron intensity (slant A) is a value that is obtained by dividing a difference in the reflected electron intensities by a distance between the vertexes.

On the other hand, the 3 types of classification denotes that the reflected electron intensities on four vertexes of one rectangular region are divided into 3 or 4 electron intensity types. In this case, two vertexes each having maximum and minimum reflected electron intensities are first selected, and then a rate of change of the reflected electron intensity (slant A) is calculated by dividing a difference in the reflected electron intensities by a distance between the vertexes. For example, in the rectangular region X43 in FIG. 23, the reflected electron intensities are divided into three types or more. If the maximum value and the minimum value of the reflected electron intensities are on at diagonal line of the region X43, the reflected electron intensities has the distribution roughly shown in FIG. 26.

Meanwhile, in both cases of the 2 type classification and the 3 type classification of the reflected electron intensities, the rates of changes of the reflected electron intensities may be calculated by the following equation (1). Now, assume that a larger reflected electron intensities is set to Rmax and also a smaller reflected electron intensity is set to Rmin on two vertexes, and a distance between two vertexes is set to B.

$$A = (R\text{max} - R\text{min})/B \qquad (1)$$

The mask for the inclined auxiliary exposure is made of the silicon plate. As described above, in the regions where the reflected electron intensities are classified into two kinds (for example, X42) and where the reflected electron intensities are classified into three kinds or more (for example, X43) on the silicon plate, a plurality of holes are formed described hereinbelow.

Figure 26:
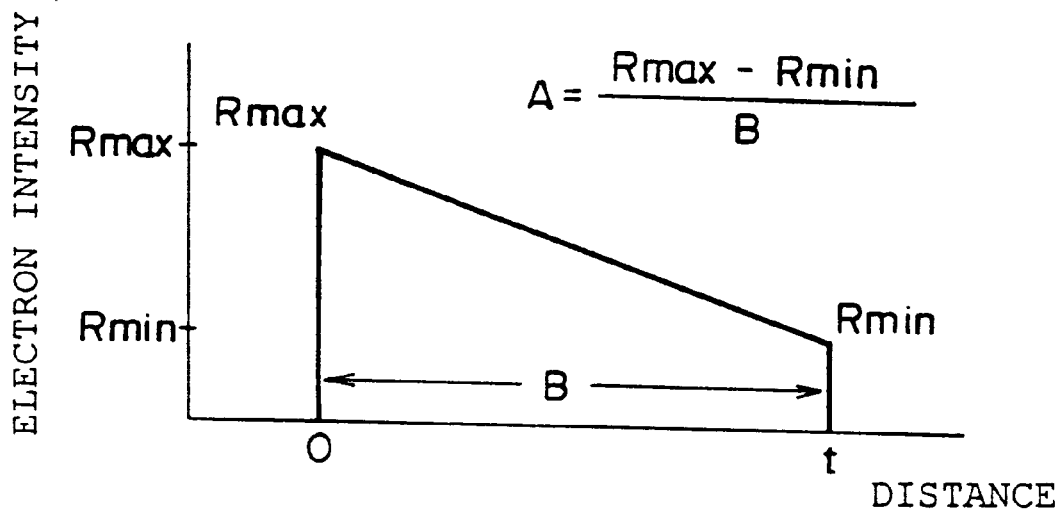
FIG. 26 is a view showing a distribution of electron intensity to illustrate a change in reflected electron intensity on the resist when exposed by employing the exposure mask in FIG. 23.

As shown in FIG. 28, the mask for the auxiliary exposure has a plurality of rectangular holes in a region corresponding to the rectangular region in FIG. 23. These holes have different open regions to compensate the inclination of the reflected electron intensities as shown in FIG. 26 to substantial zero. For instance, in FIGS. 23, 26, the holes having the largest region are formed in the portion corresponding to the vertex t of Rmin required for the largest inclined auxiliary exposure, and the holes having the smallest region are formed in the portion corresponding to the vertex o of Rmax. A plurality of holes, each having different area in proportion to the inclination A, are disposed between these two holes. Thereby, in the auxiliary exposure mask, the electrons are transmitted at the largest amount near the vertex t whereas the electrons are transmitted at the smallest amount near the vertex o.

Assume that, in one rectangular region of the auxiliary exposure mask, an area of the smallest hole (65a) is set to 1, an area of the largest hole (65e) is set to S, and an exposure amount (current value of the electron beam) is set to R, an exposure amount for suppressing degradations of the reflected electron intensities can be derived from the following equation (2).

$$SR + R\mathrm{min} = R + R\mathrm{max} \qquad (2)$$

Then an area S of the largest hole (65e) can be derived from the following equation (3).

$$S = [(R\mathrm{max} - R\mathrm{min})/R] + 1 \qquad (3)$$

In the region between the smallest hole (65a) and the largest hole (65e), an area Sx of the hole spaced apart by a distance D from the smallest hole (65a) can be derived from the following equation (4).

$$Sx = (AD/R) + 1 \qquad (4)$$

These calculations are effected in the regions where the reflected electron intensities are classified into two kinds and where the reflected electron intensities are classified into three kinds or more individually.

From the relationship described above, the auxiliary exposure mask 63 used for the exposure mask for forming the opening pattern 61A in FIG. 23 is formed as shown in FIG. 28. More particularly, a plurality of rectangular holes 64a to 64e shown in the lower right in FIG. 28 are formed in the region Y43 corresponding to the region X43 in FIG. 23. A plurality of rectangular holes 65a to 65e each having a different size and shown in the lower left in FIG. 28 are formed in the region Y42 corresponding to the region X42 in FIG. 23. In addition, a plurality of holes are formed in other regions Y11 to Y13, Y21, Y23, Y31, Y33 and Y41. However, since four vertexes have the same reflected electron intensity in the central regions X22 and X32 of the opening pattern 61A, the auxiliary exposure is not required in the two central rectangular regions Y22, Y32 shown in FIG. 28. Therefore, holes used for the auxiliary exposure are not formed. Since the auxiliary exposure has a small amount of charged particles, the pattern are not resolved just by the auxiliary exposure.

Figure 27:
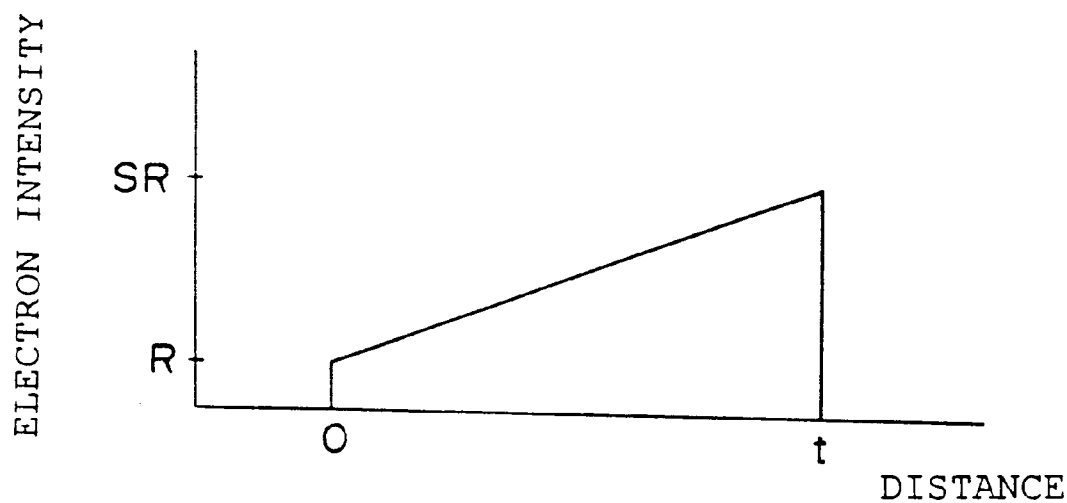
FIG. 27 is a view showing a distribution of electron intensity obtained by the auxiliary exposure.
Figure 29:
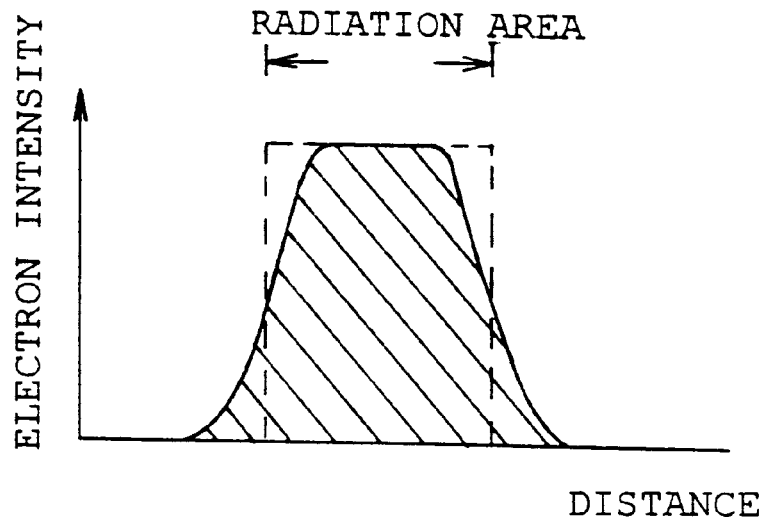
FIG. 29 is a view showing a distribution of electron intensity to illustrate a shading caused around the electron beam irradiated region.

When employing the auxiliary exposure mask 63, the auxiliary exposure as shown in FIG. 27 is effected on the resist having the distribution of the reflected electron intensities in FIG. 26. As a result, the distribution of the reflected electron intensities on the resist is corrected from the state of FIG. 24 to the state of FIG. 25, so that an inclination of the reflected electron intensities in the region corresponding to the edge portion of the opening pattern 61A and its peripheral portion can be made flat substantially. Thereby, the reflected electron intensities in the edge portion of the opening pattern 61A is increased in excess of the resolution boundary value to thus obtain a proper exposure amount. After effecting the auxiliary exposure, a pattern accuracy can be improved on the resist. The auxiliary exposure can be effected before or after the opening pattern 61A is exposed. The auxiliary exposure can also be effected by the electron beam exposure apparatus having a configuration shown in FIG. 15.

When the auxiliary exposure being made, the auxiliary exposure is effected by the exposure amount R in the region having the largest reflected electron intensities.

Therefore, if the opening pattern 61A shown in FIG. 23 is exposed, the exposure amount must be reduced by the exposure amount R.

Since the auxiliary exposure as described above is effected partially, an irradiating time of the electron beam required therefor is small so that the auxiliary exposure would not cause so serious degradation of the throughput of the exposure. In addition, since the auxiliary exposure mask 63 has holes partially, the mechanical strength of the exposure mask is not lowered and is thus solid. Furthermore, since the auxiliary exposure mask has a plurality of holes each having a different size, the distribution of the exposure amount can be varied by one electron beam shot to therefore improve the pattern accuracy.

If the opening pattern having a non-rectangular shape is transferred onto the resist, the auxiliary exposure may be performed in the edge of the opening pattern and its peripheral region by employing the electron beam having an inclined distribution.

In turn, an example of the method of calculating the reflected electron intensity will be explained hereinbelow.

At first, on the basis of the ratios of the exposure area calculated by dividing the opening pattern 61A into a plurality of rectangular regions, distances y between measuring points a to t and the center point of the rectangular regions are measured. And, the reflected electron intensity η in either one of the measuring points a to t can be derived from the following equation.

$$\eta = \sum_{i=1}^{n} \eta_i = \sum_{i=1}^{n} F(\gamma_i)$$

(Where $\alpha$, $\beta$, $\delta$, $\kappa$, are constants determined according to conditions such as kinds of the resist, thickness of the film etc.)

Third Embodiment

The third embodiment of the present invention will be described with reference to FIGS. 29 to 40B hereinbelow.

When the resist patterns are formed on the positive-type resist, the resist is smeared away with charged particles by irradiating the electron beam in the regions where the resist must be removed. However, in case such regions are smeared away by the electron beam having a large diameter, charged particles are sometimes spread into the pattern forming region because of a coulomb interaction. Therefore, this spread must be prevented.

Figure 30:
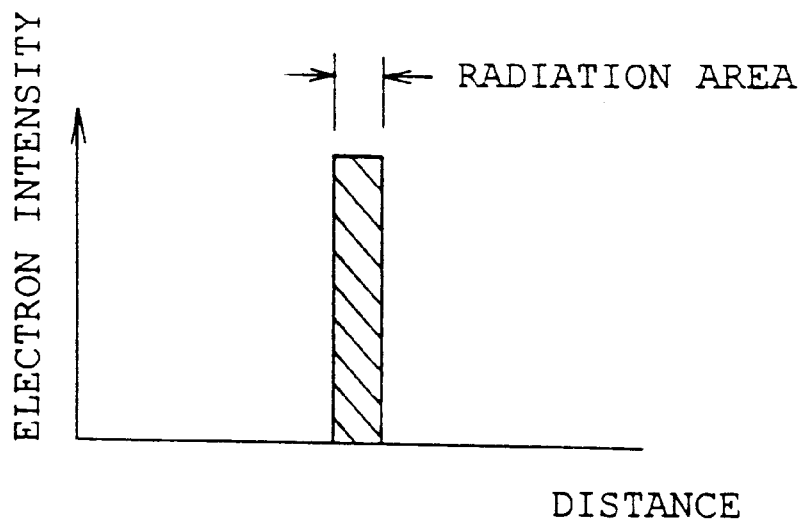
FIG. 30 is a view showing a distribution of electron intensity to illustrate a situation where no shading is caused around the electron beam irradiated region.

Thus, it can be considered that crossbeams are formed around the regions smeared away by the electron beam to divide the regions into a plurality of sections, as in the first embodiment. But, if the regions divided by the crossbeams are wide, the coulomb interaction exerts a harmful influence on the circumference, as shown in the distribution of the electron intensity in FIG. 29. On the other hand, in case, under the same current density of the electron beam, the exposure mask is divided into a plurality of narrow regions by the crossbeams, influence caused by the cross interaction effected from the charged particles irradiated regions on the circumference can be scarcely found, as shown in FIG. 30.

Figure 31:
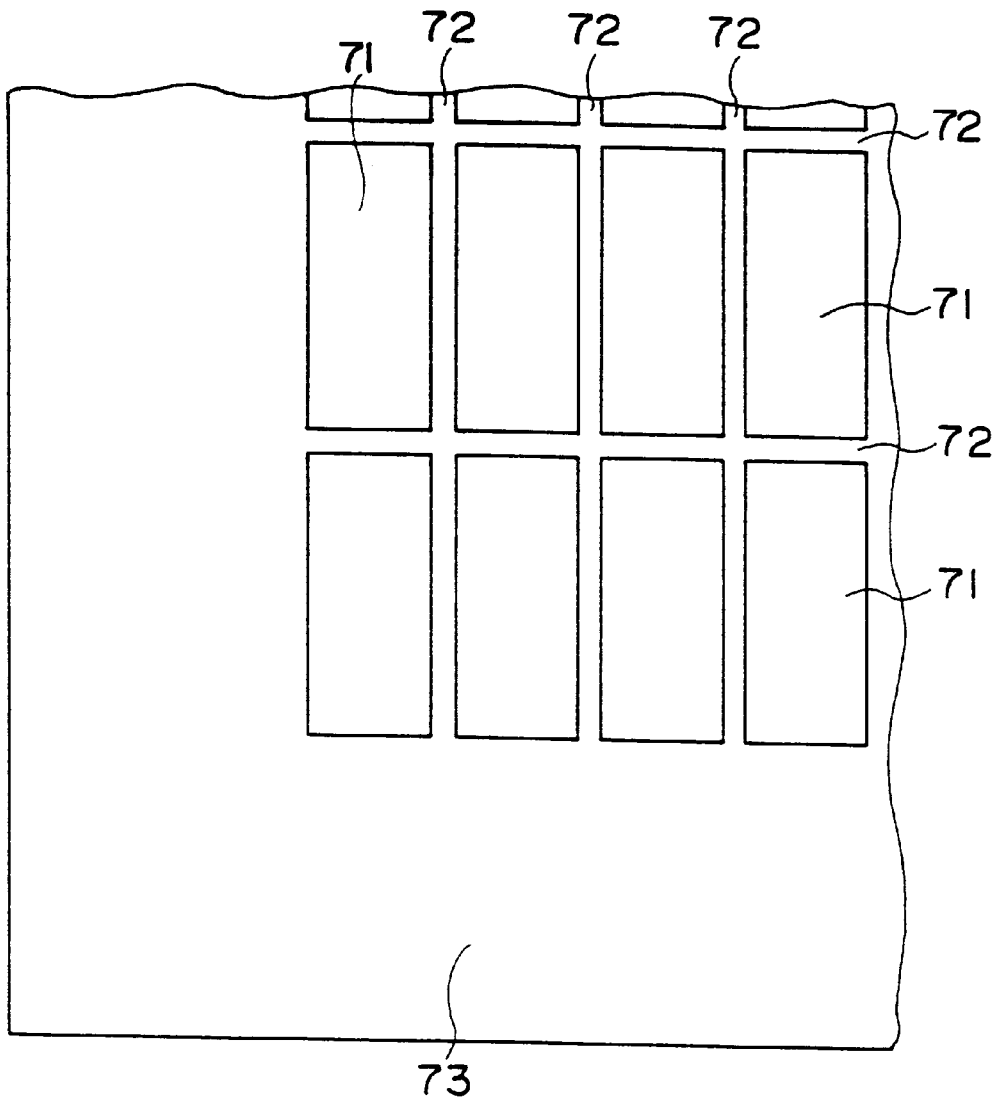
FIG. 31 is a plan view showing part of a pattern to be formed on the resist.
Figure 32:
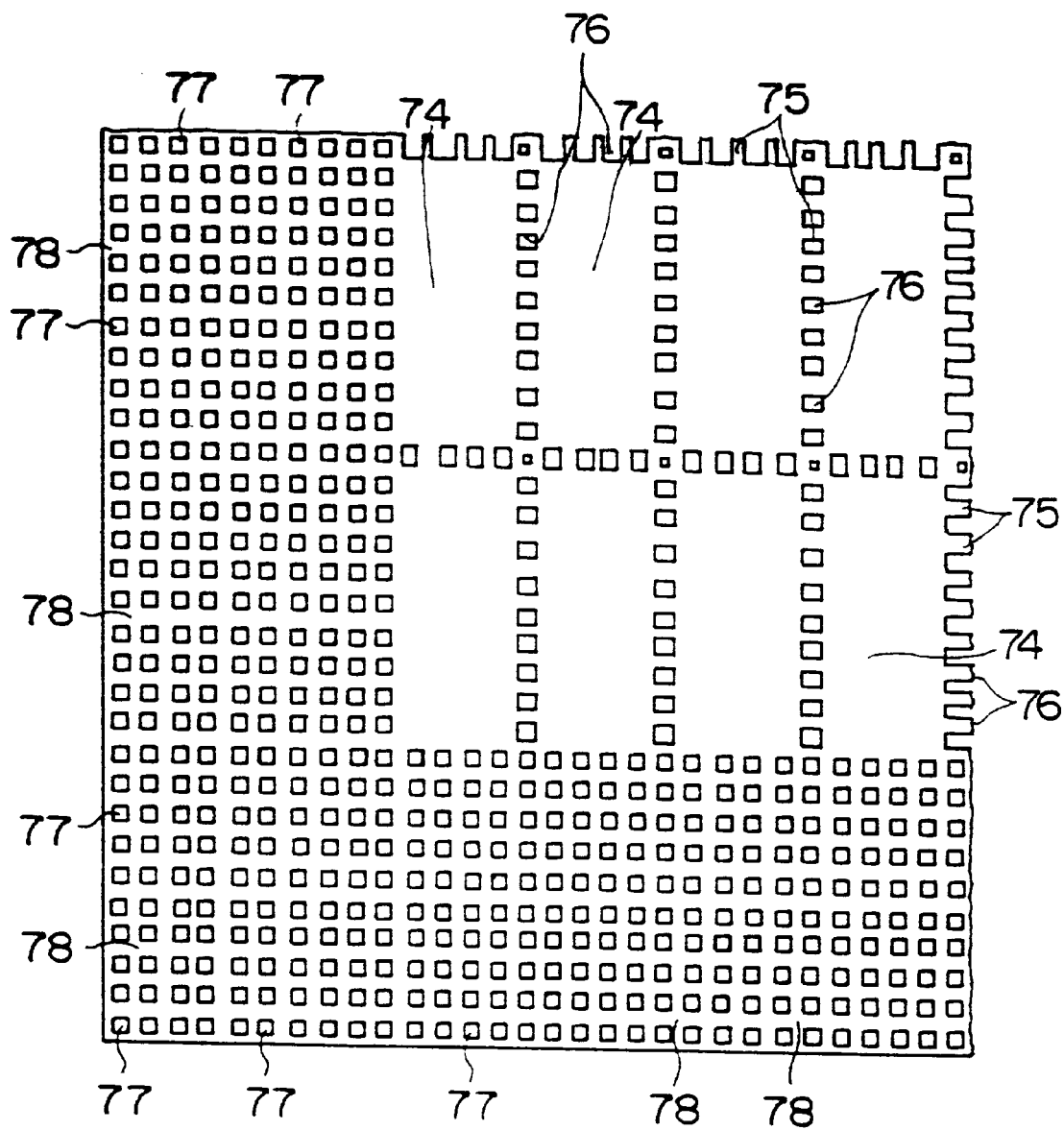
FIG. 32 is a plan view showing part of an exposure mask used for the electron beam exposure method according to the third embodiment of the present invention.

FIG. 31 shows an island-like pattern 71 of the resist formed in a matrix fashion. The island-like patterns 71 are divided by grooves 72. A wide region where no pattern is formed (pattern non-forming region) 73 is formed around the periphery of the collection region of the island-like patterns 71. In this embodiment, in order to form the island-like patterns 71 shown in FIG. 31, the exposure mask having opening patterns shown in FIG. 32 is used. The exposure mask shown in FIG. 32 is used for patterning the positive-type resist.

In FIG. 32, a reference 74 denotes an island-like pattern surrounded opening regions 76 which are divided by the crossbeams (charged particle shielding regions) 75 as described in the first embodiment. A plurality of island-like patterns 74 are formed in a matrix fashion. The plurality of island-like patterns 74 are coupled to each other by crossbeams 75. A plurality of small rectangular holes 77 are disposed around the collection region of the island-like patterns 74 in a matrix fashion. Each of crossbeams 78 has a width which is not resolved on the resist.

Size of the matrix-like holes 77 are determined as follows.

First, a region where a plurality of island-like patterns 74 are formed (referred to as a pattern forming region hereinafter) is divided into a plurality of rectangular regions each of which corresponds to one electron beam shot region, and then a ratio of exposure area in every rectangular region is calculated. Here the ratio of exposure area is defined as a value which is derived by dividing a gross area used for transmitting the electron beam within the rectangular region by the rectangular region (i.e., region irradiated by the electron beam/area of the rectangular region).

In turn, sizes and pitches of matrix-like holes 77 are determined such that the ratio of exposure area of the pattern non-forming region 73 becomes an equal value or a close value to the ratio of exposure area near the outside of the pattern forming region. In this case, if the charged particles passing through the plurality of holes 77 are irradiated onto the positive type resist during the exposure process, such close value is defined as the ratio of exposure area which can provide an exposure amount that causes the matrix-like holes 77 not to be resolved on the resist and causes the resist in the region to be completely removed by the development, and which is also close to the ratio of exposure area near the outside of the pattern forming region.

Figure 37:
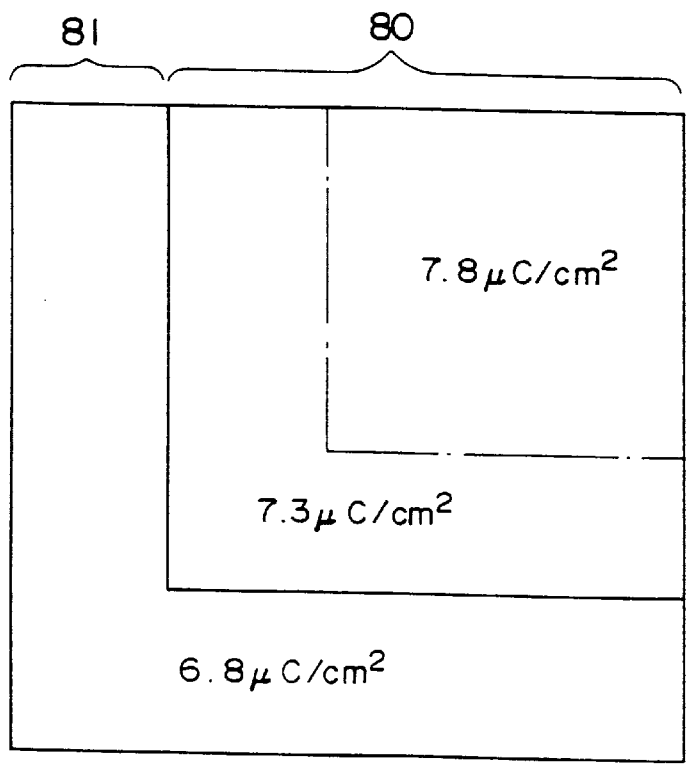
FIG. 37 is a plan view showing a distribution of charged particles in the exposure mask shown in FIG. 32.

For instance, the ratio of the exposure area in FIG. 33 described next has a range within about 12% of the exposure area of the pattern forming region. A range of the ratio of the exposure area in FIG. 34 is within 36% of the exposure area of the pattern forming region. But, as shown in FIG. 37, different exposure amounts can be employed in the pattern regions in FIGS. 33 and 34.

Figure 33:
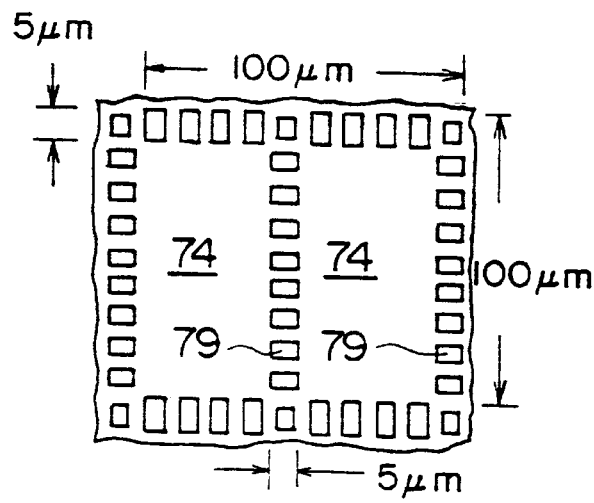
FIG. 33 is a plan view showing an example of a size of island-like patterns shown in FIG. 32.
Figure 34:
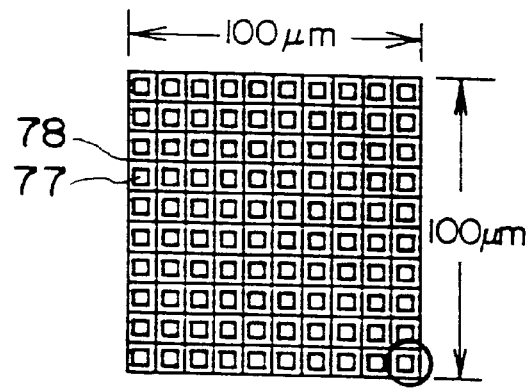
FIG. 34 is a plan view showing an example of a size of holes formed in a matrix fashion and disposed in pattern non-forming regions.
Figure 35:
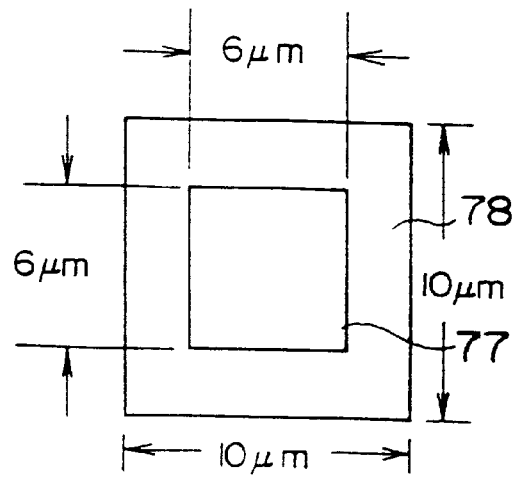
FIG. 35 is an enlarged plan view showing a hole in FIG. 34 and the crossbeam formed around the hole.

Here, respective examples in size of the island-like pattern 74 in the pattern forming region and the plurality of holes 77 outside the pattern forming region are illustrated in FIGS. 33 to 35.

Dimensions shown in these Figures are mere one examples. These dimensions are reduced to, for example, $\frac{1}{100}$ times on the resist.

As shown in FIG. 33, two island-like patterns 74 are formed in the rectangular region of 100 $\mu$m×100 $\mu$m and opening region forming regions 79, each having a width of 5 $\mu$m, are formed around two island-like patterns 74. As shown in FIG. 34, one hundred holes 77 surrounded by frames 78 are formed in a matrix fashion in a rectangular region of 100 $\mu$m×100 $\mu$m. As shown in FIG. 35, the hole 77 has a rectangular shape of 6 $\mu$m×6 $\mu$m, and the crossbeam 78 is formed along the peripheral region of the hole 77 in a range of 10 $\mu$m×10 $\mu$m. Although the crossbeam 78 has a width of 4 $\mu$m between the holes 77, the crossbeam 78 having such size cannot be resolved on the positive type resist.

Figure 36:
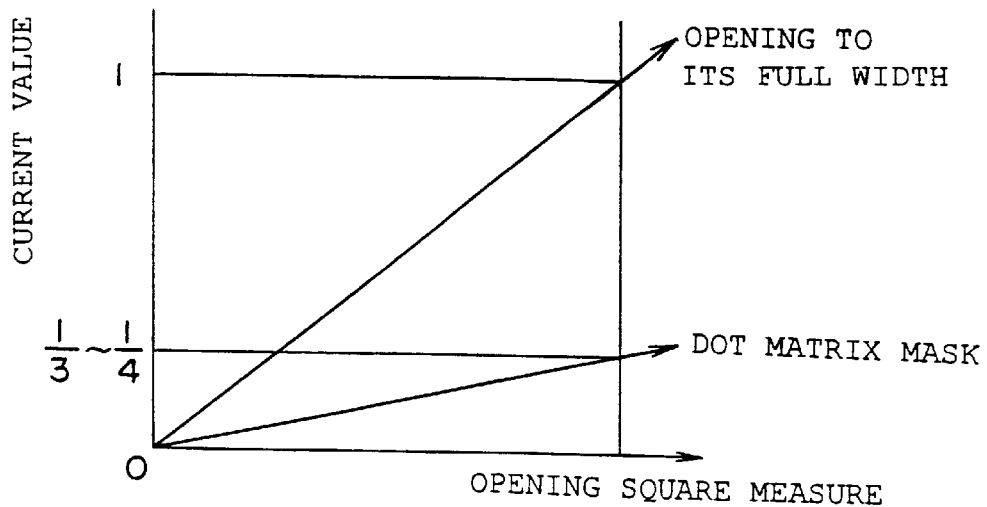
FIG. 36 is a characteristic diagram showing a relation between an aperture region and an amount of current passing through the exposure mask.

In the meanwhile, a relationship between regions of the opening regions of the exposure mask and the current amount of the electron beam is shown like FIG. 36. Note that an amount of current flowing through the opening regions increases as the areas of the opening regions are increased. Assume that an amount of current flowing through the opening regions is set to 1 under the condition where the crossbeams are not formed around the openings (full opening state), it can be seen that the amount of current passing through the hole 77 is reduced to $\frac{1}{3}$ to $\frac{1}{4}$ if the plurality of holes 77 are formed by dividing the opening regions by the crossbeams 78 shown in FIG. 34. For this purpose, an exposure time required for one electron beam shot must be set to be longer than that of the full opening state.

Now, it should be noted that, although, as shown in FIG. 32, the island-like pattern 74 and the matrix-like holes 77 are formed in one exposure mask in the above description, they can be formed respectively in separate exposure masks.

Using the exposure mask described above, the positive type resist is exposed. If the ratio of the exposure area of the pattern non-forming region 73 is different from that of the pattern forming region near the pattern non-forming region 73, these exposure amounts are made to be different, so that the proximity effect can be corrected. The exposure amounts are set to values determined by the experiments performed by the present inventor.

For example, as shown in FIG. 37, a dose amount of the charged particles inside the region spaced apart from the edge of the pattern forming region 80 by 4 $\mu$m is set to 7.3 $\mu$C/cm$^2$. A dose amount of the charged particles in the region near the more central portion is also set to 7.8 $\mu$C/cm$^2$. In addition, the charged particles are irradiated in an region 81 outside of the pattern forming region 80 so as to obtain the dose amount of 6.8 $\mu$C/cm$^2$.

Figure 38:
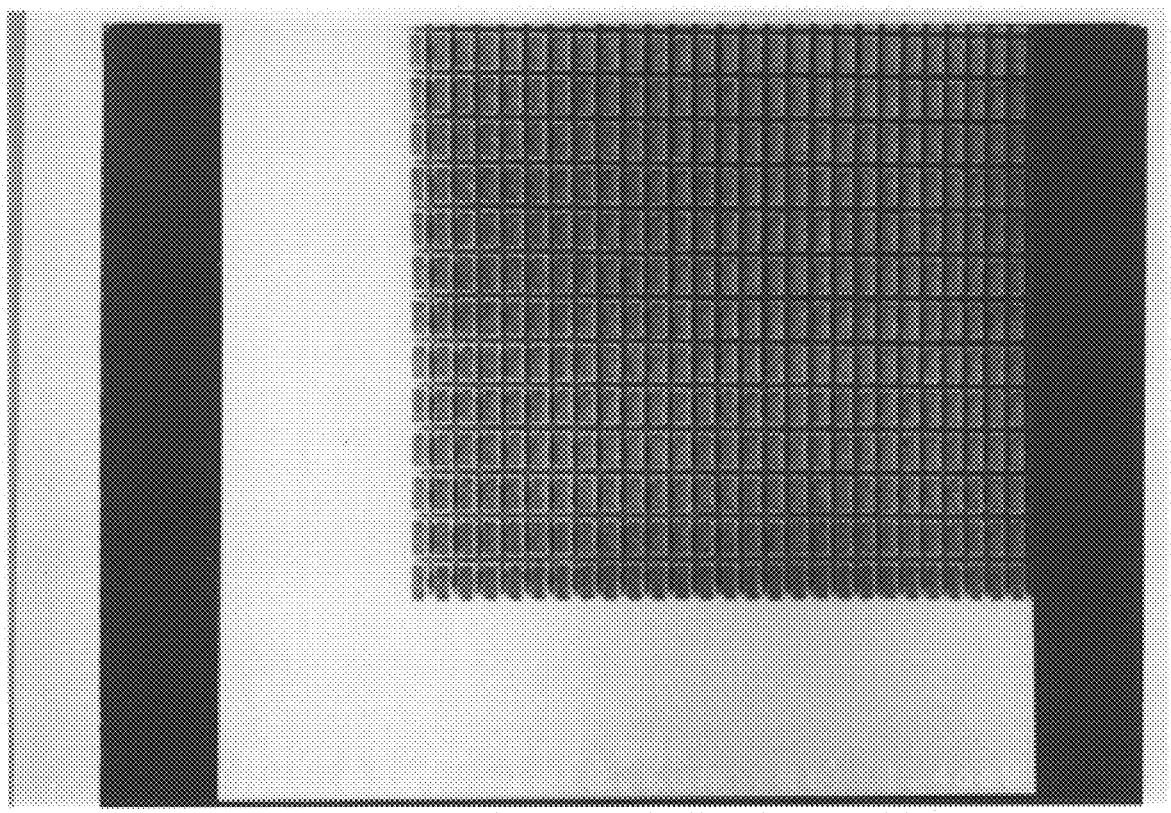
FIG. 38 is a microphotograph showing a resist pattern formed via the exposure process using the exposure mask used for the electron beam exposure method according to the third embodiment of the present invention.

When the positive type resist is exposed with such dose amount by using the exposure mask having patterns in FIG. 32 and is over-exposed, a result shown in a microphotograph of FIG. 38 has been derived. The exposure apparatus shown in FIG. 15 has been employed to expose the resist. In FIG. 18, black portions show the resist patterns.

Figure 39A:
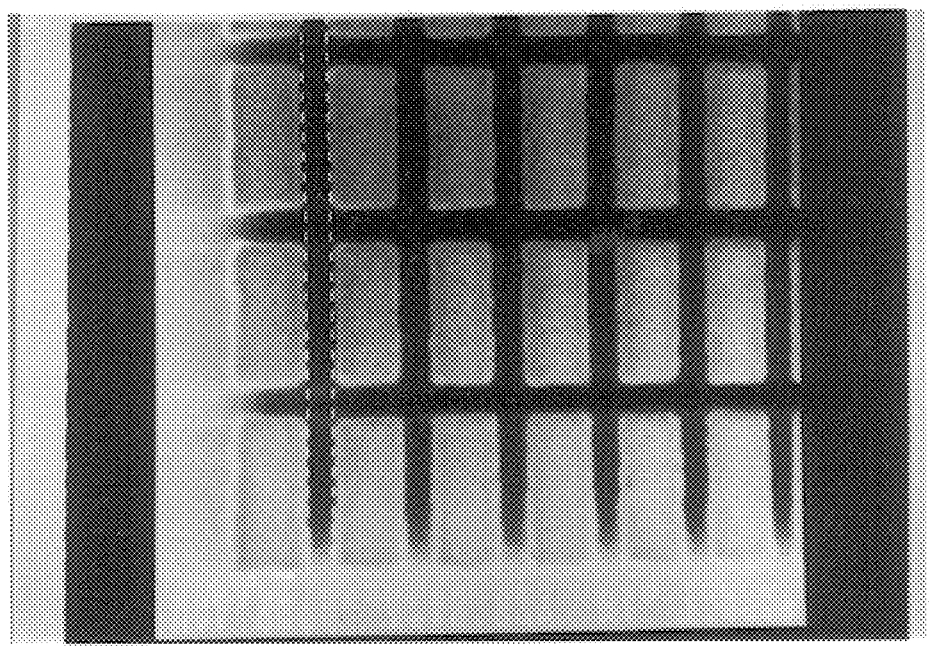
FIGS. 39A and 39B are microphotographs showing respectively enlarged parts of the pattern of the photograph in FIG. 22.
Figure 39B:
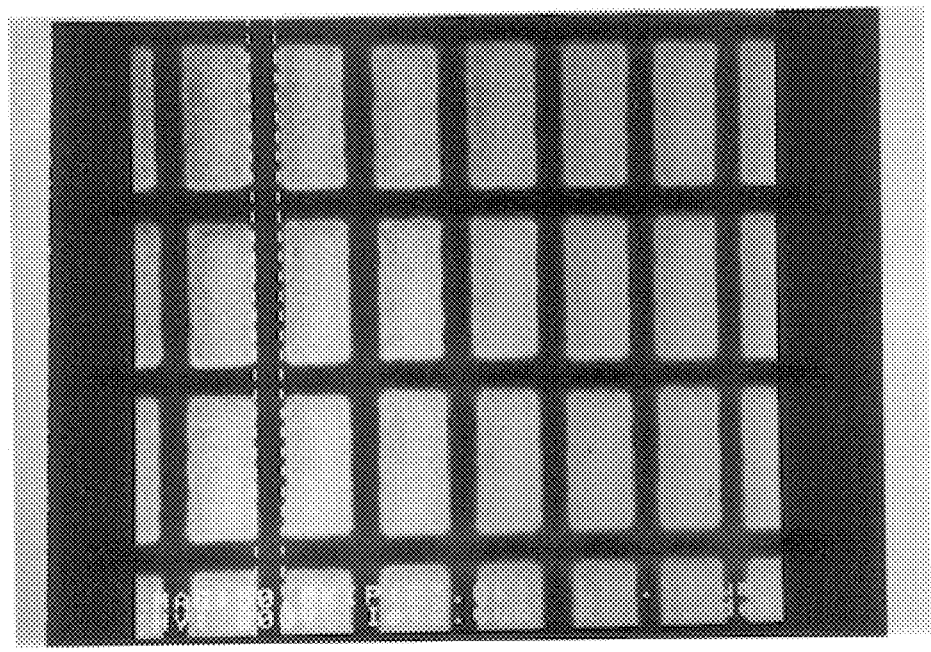

When the island-like patterns near the outside of the pattern forming region are enlarged and viewed on the microphotograph, a result shown in FIG. 39A can be derived, i.e., the island-like patterns, each having a good shape, can be derived. Furthermore, when the island-like patterns near the central portion of the pattern forming region is enlarged and watched by the microphotograph, a result shown in FIG. 39B can be derived. At this time, a line width of the electron beam is set to be about 0.13 $\mu$m.

Figure 40:
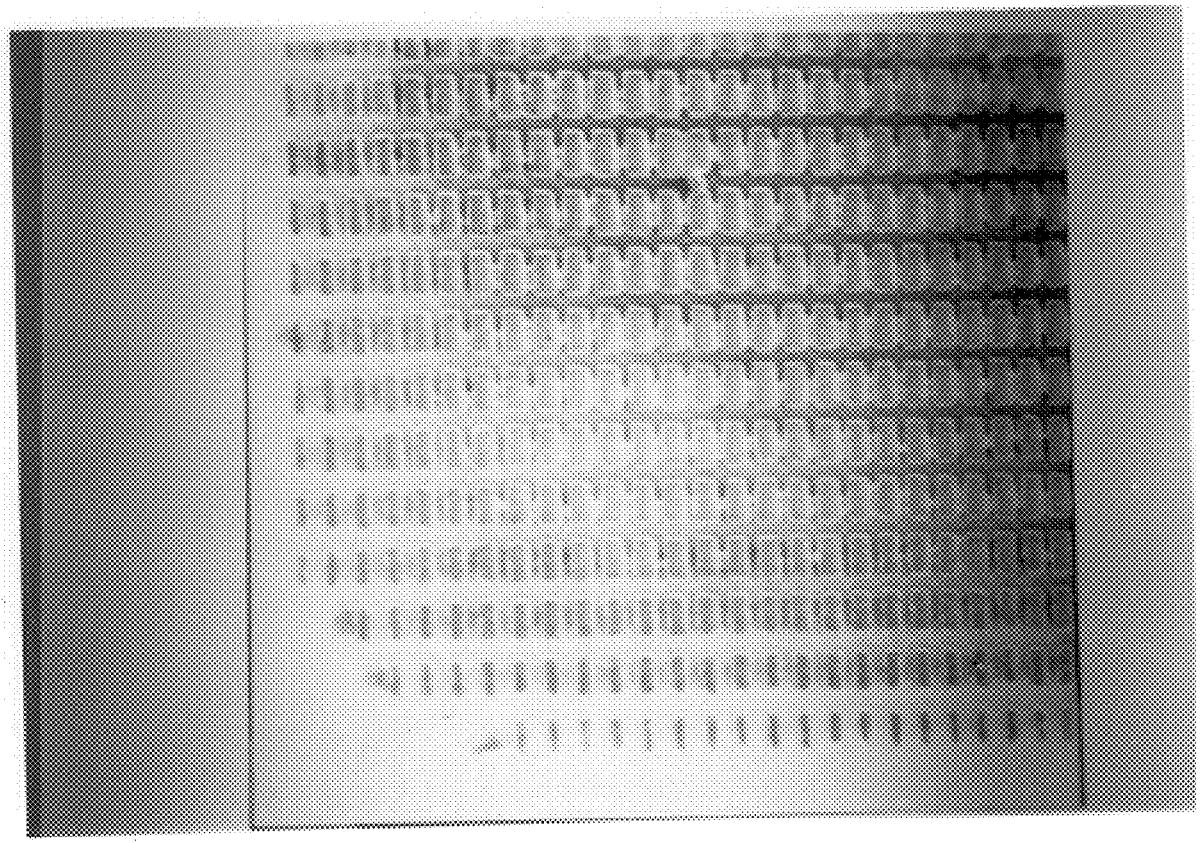
FIG. 40 is a microphotograph showing the resist pattern formed via the exposure process without the exposure mask used for the electron beam exposure method according to the third embodiment of the present invention.
Figure 41A:
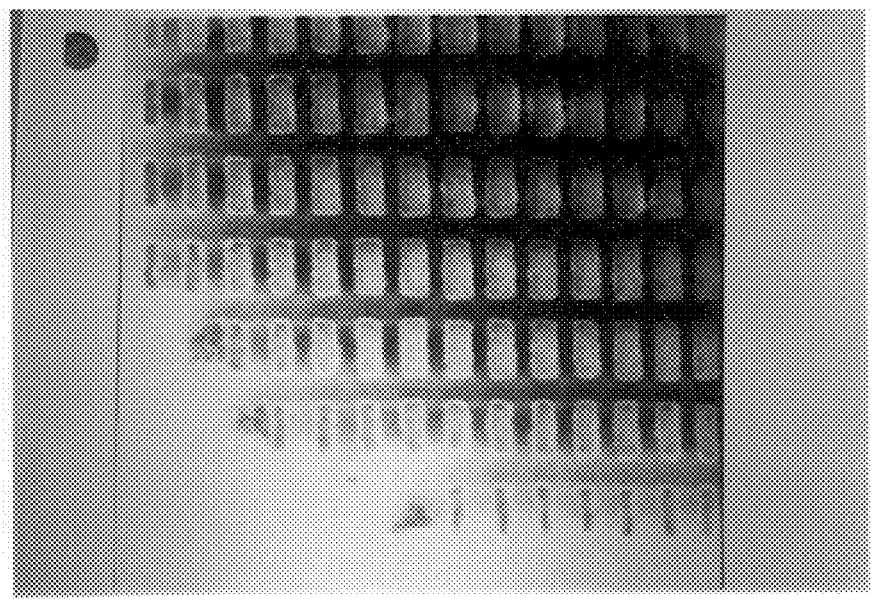
FIGS. 41A and 41B are microphotographs showing respectively enlarged parts of the pattern of the photograph in FIG. 39.
Figure 41B:
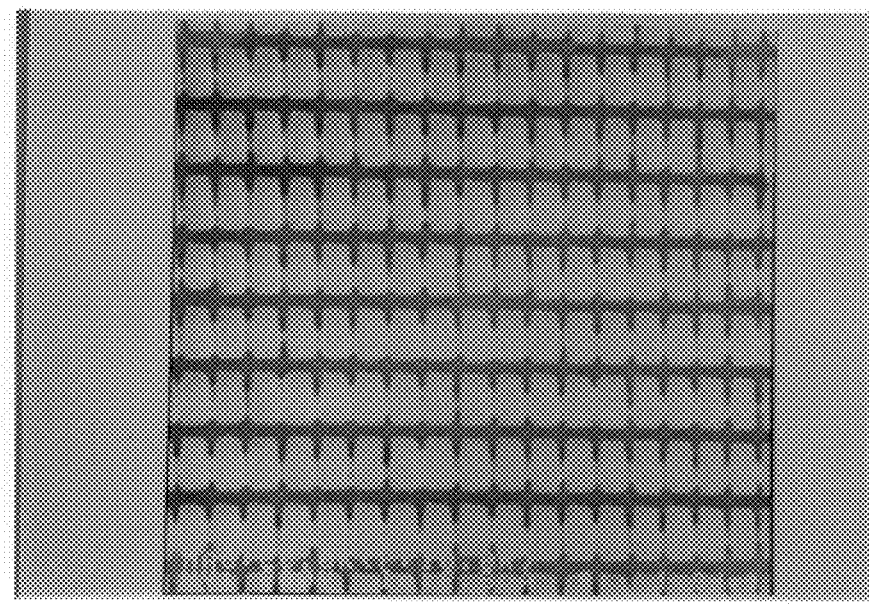

On the contrary, upon exposing the region 81 outside the pattern forming region 80, a result shown in a microphotograph of FIG. 40 can be derived if the exposure mask without the matrix-like holes 77 shown in FIG. 34 is employed, and the exposure amount is not changed. According to this microphotograph, it can be found that part of the island-like patterns near the outside of the pattern forming region is eliminated, or the island-like patterns are narrowed as shown in the enlarged microphotograph in FIG. 41A. In addition, a tendency to a narrow pattern is not caused in the island-like patterns in the central region of the pattern forming region, but, as shown in FIG. 41B, there exists the island-like patterns having narrow distances therebetween and the island-like patterns coupled to adjacent island-like patterns.

With the above, if a wide region of the resist is smeared away by the electron beam, the exposure mask having the matrix-like holes as in the third embodiment, if employed, can reduce the coulomb interaction and suppress bad influences on the patterns significantly. Moreover, since the exposure mask can be formed by simply opening holes 77 in the silicon substrate, it can be formed simply in the process and strong. In the exposure mask, if sizes and locations of the holes 77 are determined to make an exposure amount per unit area uniform, the reflected electron intensity can be neglected. When the exposure mask having the matrix-like holes is employed, the exposure of the resist can be attained sufficiently by one electron beam shot and therefore the throughput thereof is scarcely reduced.

Although the exposure of the positive-type resist has been explained in the third embodiment, the present embodiment can also be applied to the negative type resist in the meaning of suppressing the cross-interaction.

Incidentally, dimensions of the opening regions and the patterns in the above embodiments are not restricted to these dimensions. Also the patterns of the exposure masks are reduced on the resist and transferred thereon.

In a fourth embodiment of the present invention, there will be explained another exposure method of suppressing degradation in pattern precision produced by the proximity effect.

The above degradation in pattern precision due to the proximity effect will be not only caused by a shape and a size of each aperture pattern (i.e., transmission hole) formed in the block-mask, but also determined depending on whether or not another pattern surrounding the periphery of the aperture pattern exists. The block-mask will be referred to as a mask hereinafter.

As shown in FIG. 43, for instance, if an insulating layer 202 such as an patterning object on a semiconductor wafer 201 is patterned, a EB resist film 203 is first applied to the insulating layer 202, then a charged particle beam (referred to as "electron beam" hereinafter) is irradiated onto the resist film 203. The electron beam is then scattered in the resist film 203, insulating layer 202, and the semiconductor wafer 201, so that the proximity effect may be produced as illustrated in FIG. 43.

As also shown in FIG. 44, formed in a mask 210 for use in exposure are a plurality of block patterns, each of which has a plurality of transmission holes (electron beam through holes) 211 to 214 therein. By way of example, when the electron beam is irradiated onto such block patterns in terms of one shot projection, it passes through the first to fourth transmission holes 211 to 214, and is then reduced by an electromagnetic lens so as to irradiate onto the resist film 203.

The first to fourth transmission holes 211 to 214 are respectively quadrangular patterns to have the same length in the y direction, which are aligned in parallel at a distance. The first transmission hole 211 is a square pattern having a largest area, while the second to fourth transmission holes 212 to 214 are respectively rectangular patterns.

Curves 221 to 224 shown in FIG. 44 denote exposure amount on the resist film 203 provided by electron beams passing through respective transmission holes 211 to 214 if viewed from the I—I line. A superposition of these curves 221 to 224 results in a curve 220 shown in FIG. 44.

If the resist film 203 being exposed is developed, respective transfer patterns may be obtained as reduced patterns of the first to fourth transmission holes 211 to 214. In fact, as shown in FIG. 44, only regions which are exposed in excess of the threshold value appear as first to third transfer patterns 231 to 233.

Referring to FIG. 44, the first to fourth transmission holes 211 to 213 and the first to third transfer patterns 231 to 233 are depicted on the same scale. Actually, sizes of the first to fourth transmission holes 211 to 213 are however n time as large as those of the transfer patterns. Therefore, when being designed, exposure positions and sizes of the transfer patterns 231 to 233 depicted on the abscissa of the graph are reduced 1/n times in contrast to the mask 210.

As can be seen from FIG. 44, because of the proximity effect, widths of the transfer patterns 232 corresponding respectively to the first transmission hole 211 having the largest area and the second transmission hole 212 adjacent to the hole 211 are expanded in the x direction in comparison with those of desired transfer patterns. On the other hand, because of the proximity effect, widths of other transfer patterns 232 are contracted in the x direction in contrast to those of desired transfer patterns. Besides, transfer patterns corresponding to the fourth transmission holes 214 are not formed. However, the lengths of the first to third transfer patterns 231 to 233 in the y direction are derived as the substantially desired length.

Furthermore, as shown in FIG. 44, since a larger amount of scattered electrons are gathered to a side portion P1 of the first transmission hole 211 from its surroundings in contrast to those gathered to a corner portion P2 from its surroundings, the transfer pattern 231 is bulged. As a result, the largest transfer pattern 231 and the neighboring transfer pattern 232 come close to each other at their center portions of sides.

As for pattern deformation due to the proximity effect, there can be correction methods (1) to (3) as follows:

(1) After the resist is exposed slightly employing an additional mask in which inverted patterns of light transmission regions and light shielding regions are formed, it is exposed using the mask having required regular patterns therein. This exposure method is called a ghost exposure method.

(2) The entirety of the exposure patterns is divided into a plurality of rectangular regions, i.e., a plurality of blocks, then an exposure amount suited for each rectangular region is calculated, and then the magnitude of the exposure amount every rectangular region is adjusted so as to correct the proximity effect. As one method of adjusting the exposure amount, size of the blocks may be varied.

(3) Metal nets are pitched over the transmission holes, then an amount of the charged particles transmitted through the transmission holes is changed by varying area and/or sizes of meshes of the metal net.

However, in the method (1), both the regular patterns and the inverted patterns must be exposed. In the method (2), the size of the rectangular regions must be contracted. Throughput of exposure is thus lowered inevitably in both methods (1) and (2). In the method (3), since the metal net is frangible and broken down easily, it is hard to fabricate the mask, so that much time is required to prepare the mask. In any event, since an appropriate exposure amount to correct the proximity effect would not be uniform in one transmission hole, all the aforementioned methods (1) to (3) are difficult to meet the above requirement. Bulge of the transfer patterns cannot therefore be eliminated by the above methods (1) to (3). For this reason, miniaturization of the patterns would be restricted.

Subsequently, the fourth embodiment of the present invention will be explained in more detail hereinafter.

First Example

Referring to FIGS. 45A and 45B, a mask forming method according to a first example of the fourth embodiment will be explained.

This mask may be used in the electron beam exposure apparatus to expose the resist in terms of block exposure. The block exposure is such an exposure method that the electron beam is shaped by the block patterns and then irradiated onto the resist.

A large number of block patterns to be used repeatedly are provided in the mask. The electron beam is shaped by selected block pattern. The block pattern is thus reduced and projected by one shot electron beam onto the resist on the exposure object (e.g., semiconductor wafer).

As shown in FIG. 45A, first to fourth pattern regions 241 to 244 similar to desired patterns are arranged in a first design region 241 wherein block patterns are to be formed. Outer shapes of the first to fourth pattern regions 241 to 244 are identical to those of the transmission holes 211 to 214 shown in FIG. 44.

Next, as also shown in FIG. 45A, the first to fourth pattern regions 241 to 244 are divided respectively into plural divisional rectangular regions 245, each having the same size.

As shown in FIG. 45B, the rectangular regions 246 of the same size are then arranged one by one in respective divisional rectangular regions 245. Where it is assumed that a ratio of the area (S2) of the rectangular regions 246 to the area (S1) of the divisional rectangular regions 245 is k (k=S2/S1), and a proper exposure amount, i.e., threshold exposure amount in the case of FIG. 44 is E0.

Depending upon design data such as sizes, positions etc. of the first to fourth pattern regions 241 to 244, the divisional rectangular regions 245, and the rectangular regions 246 in such design region 240, the mask using the rectangular regions 246 as the transmission holes has been formed. If the electron beam is irradiated onto the transmission holes 246 of the above mask under the exposure amount E=Eo/k, transfer patterns can be obtained which are substantially identical to the transfer patterns 231 to 233 shown in FIG. 44 not subjected to the proximity correction. This fact has been confirmed experimentally. The area $S_0$ of the transmission hole is not expressed by the dimension on the wafer, but the dimension on the mask.

In this case, because of diffraction of electron beams transmitted through the transmission holes and the proximity effect caused in the resist film, the charged particles are irradiated onto the resist film portions corresponding to regions between neighboring divisional rectangular regions 245.

In order to reduce the influence of exposure due to the proximity effect, in the resist film, an exposure amount through one rectangular region 246 (transmission hole) increased by scattered electrons through from other rectangular regions (transparent holes) has to be calculated. If, with increase of the increased exposure amount, the size of the rectangular regions 246 (transmission holes) is made smaller than the area $S_0$ to thus correct the exposure amount, bulge and reduction of the first to fourth pattern regions 241 to 244 can be suppressed. However, even if scattered electrons generated by the proximity effect etc. remain therein, the area $S_0$ of the rectangular region 246 (transmission hole) providing a minimum exposure amount is maintained as it is, and therefore the size of the rectangular region 246 is not changed.

It will in turn be explained with reference to FIG. 46 to form an actual mask employing the rectangular regions 246 having the corrected size as the transmission hole.

As shown in FIG. 46, the transmission holes 256 of the size obtained after the above design data of the rectangular region 246 being corrected are formed on the silicon substrate by the photolithography technique, for example, so as to fabricate the mask 250. For purposes of simple illustration, only block patterns onto which one shot electron beams are irradiated are depicted in FIG. 46 although a number of block patterns are in fact formed in the mask 250. Block patterns include respectively the first to fourth pattern regions 241 to 244.

In the mask 250 in FIG. 46, the charged particles are passed through the transmission holes a to g in regions formed along the line II—II and then irradiated onto the exposure object so as to exhibit exposure (charged particle amount) distribution indicated by the chain lines in FIG. 46. If a superposition of these chain lines result in the curve 60 indicated by the solid line. If the resist being subjected to the exposure is developed, transfer patterns 271 to 274 can be derived, as shown in FIG. 46, to retain desired patterns in which the proximity effect has already been corrected.

Since the proximity effect to be generated in respective portions of the first to fourth pattern regions 241 to 244 may be corrected by size adjustment of the transmission hole 256, sufficient correction of the proximity effect can be provided. As a result, bulge and thinness shown in FIG. 44 can be reduced.

Since both the regular pattern mask and the inverted pattern mask as mentioned above are not required or since the block patterns are not contracted to correct the proximity effect, reduction in throughput of the exposure process can be prevented. Furthermore, the mask structure on which the metal net is put up can be eliminated, easy mask fabrication can be achieved.

Second Example

FIG. 47 shows a transfer pattern to be formed on the positive type resist, which consists of block regions 280 divided by the chain line and block masks corresponding to B1 to B8. In FIG. 47, charged particles are irradiated onto the hatched region, and an exposure amount to be removed by the developing liquid is required therein.

If such transfer patterns are formed, left portions 281 to 284, A1 to A5 result in on the resist. When the light shielding portions corresponding to such left portions 281 to 284, A1 to A5 are formed in the conventional mask (not shown), such light shielding portions are not formed as the light shielding portions, i.e., they are omitted since the transmission holes are formed around such light shielding portions.

FIG. 48 shows the block region 280 in FIG. 47 in an enlarged fashion. If the structure illustrated in the first example is adopted to form the block region 280 on the mask, the mask will be obtained wherein hatched portions shown in FIG. 49 serve as the transmission holes.

According to the mask, light shielding portions corresponding to the left portions 281 to 284 are supported by their peripheral portions. Besides, throughput can be enhanced in contrast to the exposure method recited in Patent Application Publication (KOKOKU) 63-11657 wherein two patterns are exposed separately.

Even if plural transfer patterns are formed in one block of the resist to have the same shape, different patterns are formed on the block mask correspondingly to the plural transfer patterns based on respective surrounding pattern arrangements, etc. This fact would render design of the block mask more troublesome than the conventional one. However, the block mask may be utilized many times in exposure, so it has high availability.

Third Example

Since all the exposure patterns of the mask can in general be partitioned into rectangular patterns, it becomes important how to form ordinarily the transmission holes which are to be formed in the rectangular patterns. A design method of sizes and locations of the transmission holes and a forming method of the transmission holes will be explained with reference to FIGS. 50 to 53 hereinbelow.

As shown in FIG. 50, first a rectangular pattern 290 is partitioned into plural portions on the basis of standard rectangular patterns P41 in design stage. The electronbeam through the rectangular pattern 290 is irradiated onto a resist film.

It is assumed that a length of the rectangular pattern 290 in the x direction is $L_x$, and a length of the same in the y direction is $L_y$. And, it is assumed that a length of the standard rectangular pattern P41 in the x direction (rectangular divisional standard length) is $M_x$, and a length of the same in the y direction (rectangular divisional standard length) is $M_y$.

The length of $M_x$ and $M_y$ would be decided, for example, as follows.

First several lengths are selected as $M_x$ and $M_y$ respectively within 0.1 to 0.3 $\mu$m. This range of 0.1 to 0.3 $\mu$m being used is selected because it is believed that the optimum value will be obtained within the range of 0.2 $\mu$m±0.1 $\mu$m, where a line width of 0.2 $\mu$m is a minimum one to form patterns.

Then as for respective lengths, dimensions of the transparent holes are decided according to design process described according to design process described hereinafter. After the transparent holes are implemented in the mask, electron beam exposure is then carried out. On the basis of the results of such experiments or further calculations, the length of $M_x$ and $M_y$ may be finally decided which allow result patterns to have highest precision.

As the result that the rectangular pattern 290 have been partitioned based on the standard rectangular patterns P41, smaller area portions than the standard rectangular pattern P41 sometimes remain. In this event, reduced patterns wherein a length of the standard pattern in the x direction is $N_x$ and a length of the same in the y direction is $N_y$ are calculated according to the following two equations to use as secondary standard patterns 295.

$$N_x = L_x/[L_x/M_x] \quad (40)$$

$$N_y = L_y/[L_y/M_y] \quad (41)$$

In the above equations, [ ] means an integral number obtained by raising of less than unit, i.e., raising of fraction less than decimal point. A size of the secondary standard pattern 295 is determined such that, if this secondary standard pattern 295 is used as the transmission hole, the resist exposed by the charged particles passing through the transmission holes can not be resolved due to the proximity effect as a boundary line pattern of the transmission holes.

Subsequently, as shown in FIG. 51, the rectangular pattern 290 is partitioned on the basis of the secondary standard patterns 295. More specifically, the secondary standard patterns 295 of integral number are spread all over the rectangular pattern 290.

Then, as shown in FIG. 51, divisional rectangular patterns 296 are superposed on respective secondary rectangular standard patterns 295. The divisional rectangular pattern 296 has a length $S_x = N_x - 2d_x$ in the x direction and a length $S_y = N_y - 2d_y$ in the y direction. Where $2d_x$ denotes a distance between adjacent divisional rectangular patterns 296 in the x direction, and $2d_y$ denotes a distance between adjacent divisional rectangular patterns 296 in the y direction. Formed between edges of the divisional rectangular patterns 296 and edges of the secondary standard patterns 295 are rectangular frame-like areas each of which has a width $d_x$ in the x direction and a width $d_y$ in the y direction. These rectangular frame-like areas serve as crossbeams in the actual mask.

A size of the divisional rectangular pattern 296 may be determined in the following manner. In other words, in case the divisional rectangular patterns 296 are used as the transmission holes, the charged particles passing through the transmission holes to irradiate onto the resist may be spread over the areas, which can be resolved to have the same size as reduced dimension of the secondary standard pattern 295, because of diffraction of the charged particles and influence of the proximity effect.

On the other hand, two distances $2d_x$, $2d_y$ between the divisional rectangular patterns 296 are determined to meet the following two conditions.

(1) In the event that the divisional rectangular patterns 296 are used as the transmission holes, the resist is exposed to the electron beams passing through the transmission holes not to transfer the frame-like areas thereon because of diffraction of the charged particles and influence of the proximity effect. Consequently, continuous transfer patterns can be formed on the resist.

(2) Sufficient mechanical strength of the mask wherein the divisional rectangular patterns 296 are employed as the transmission holes can be assured by the frames formed in the frame-like regions.

Moreover, $d_x$ and $d_y$ become too small if $N_x$ and $N_y$ are set too small, while the proximity effect may be corrected insufficiently if $N_x$ and $N_y$ are set too large. $N_x$ and $N_y$ must thus be set within an appropriate range.

Basically the electron beams should be irradiated onto the entirety of the secondary standard patterns 295. However, since the electron beam actually pass through the divisional rectangular patterns 296 in the third example, a total amount of the charged particles to be irradiated onto the resist may be reduced less than a desired amount E0. Thus, not to reduce an irradiation amount of the charged particles, usual irradiation time $T_0$ for one shot must be corrected to T according to the following equation.

$$T = T_0 \cdot (N_x/S_x) \cdot (N_y/S_y) \quad (42)$$

Dimensions $d_x$, $d_y$, $S_x$, $S_y$ are further modified every secondary standard pattern 295 as shown in the following.

The size of the aforementioned rectangular pattern 290 is supposed to form patterns on the resist on a reduced scale of 1/100, for example. In this case, as shown in FIG. 52, if the entire area of the rectangular pattern 290 is used as the transmission hole, the patterns formed on the resist are bulged with the proximity effect etc. when such transmission hole is too large.

Therefore, in a further design stage, after the divisional rectangular patterns 296 are arranged one by one in respective secondary standard patterns 295, size of the divisional rectangular patterns 296 may be modified by calculating a correction amount of the proximity effect as follows:

When the electron beam is irradiated on a point O, the charged particles are spread over a neighboring area of the point O because of the proximity effect to thus form rotationally symmetric charged particle (exposure amount (dosage)) distribution. If a distance from the point O is r, dosage f(r) on a point remote from the point O by the distance r can be derived from the following equation.

$$f(r)=a \cdot \exp(-(r/b)^2)+c \cdot \exp(-(r/d)^2) \qquad (43)$$

In this equation (43), a first term expresses forward scattering due to the proximity effect, and a second term expresses back scattering due to the proximity effect. Constants a to d can be derived from the experiment. The equation (43) has already been known in the art.

Here r denotes a distance on the resist and the distance becomes n times on the mask. But this n may be applied if the patterns in the mask is exposed on the reduced scale of 1/n.

According to the equation (43) of f(r), the charged particle distribution having its peak on the point O can be formed. The distance r is given as R where the peak value of the charged particle distribution is attenuated to a rate p. A magnitude of the charged particle amount attenuated from the peak value to a rate p is an exposure threshold, for example.

In this event, the following relation may be formulated if the dosage at the distance R from the point O is assumed as f(R).

$$f(R)/f(0)=p \text{ (selected value)} \qquad (44)$$

The value p is a smaller value than a unit such as 1/8, for instance. In addition, f(R) may be set to the charged particle amount providing the exposure threshold value, for example.

Next, as shown in FIG. 52, virtual lines $T_x$, $T_y$ are drawn at the distance R from the intersection point of diagonal lines of the rectangular pattern 290 in the x, y directions. Four rectangular regions 297 are arranged which are adjacent to the intersection point of the virtual lines $T_x$, $T_y$ and have the virtual lines $T_x$, $T_y$ as respective two sides. Other rectangular regions 297 having the same size are then arranged adjacently to the circumference of the rectangular region 297. It may be evident that other patterns (not shown) are arranged around the rectangular pattern 290.

Now an occupied area ratio of the rectangular pattern 290 to the rectangular region 297 is set at λ. The area ratio λ of the rectangular region to sixteen surrounding rectangular regions are then calculated. In FIG. 52, the area ratio λ is indicated by the numeral put in parentheses. For example, it may be seen that, in the area labeled numeral 0 in the parentheses, no transmission hole is formed.

With reference to FIG. 52, an exposure correction coefficient Q is then calculated to correct $S_x$ and $S_y$ shown in FIG. 51. The exposure correction coefficient Q can be derived from the following equation.

$$Q=1/(1+C \cdot \eta) \qquad (45)$$

The correction coefficient Q is less than or equal to a unit. The smaller the value of the exposure correction coefficient Q, the more the correction amount.

For instance, the value of C would be determined in the following manner. First, several values of C must be selected within the range of 0 to 1. Then as to respective values, dimensions of the transparent holes are decided according to design process discussed hereinafter. The transparent holes are then implemented in the mask to effect the electron beam exposure. The value of C required for permitting resultant patterns to be achieved with highest precision can be determined according to the results of either experiments or calculations.

Where C is a constant obtained according to the experiment, and less than or equal to a unit. The η denotes the charged particle amount which is added to i-th rectangular region 297 due to the proximity effect. The charged particle amount may be obtained due to both the proximity effect caused by the i-th rectangular region 297 per se and the proximity effect caused by m neighboring rectangular regions 297.

The i-th $\eta_i$ can be calculated by the following equation.

$$\eta_i = \Sigma \lambda_i \cdot T_x \cdot T_y \cdot f(r_i) \qquad (46)$$

Where a symbol Σ denotes a total sum of i=0 to m. In FIG. 52, i=0 to 8. Further, $\lambda_i$ denotes the area ratio λ in the i-th rectangular region 297, and $r_i$ denotes the distance between the center of gravity of the i-th rectangular region 297 and the center of gravity of the neighboring rectangular region 297. Now the distance $r_0$ is 0.

For example, the following is the charged particle amount due to the proximity effect caused by the 0-th (i=0) rectangular region 297 in FIG. 52.

Here, if $T_x$, $T_y$ are 1 μm respectively, distances $r_1$, $r_3$, $r_5$ and $r_7$ from the center of gravity of the 0-th (i-th) rectangular region 297 to the 1-st, 3-rd, 5-th, and 7-th (i-th) rectangular region are "1" respectively. Distances $r_2$, $r_4$, $r_6$ and $r_8$ from the center of gravity of the 0-th (i-th) rectangular region 297 to the 2-nd, 4-th, 6-th, and 8-th (i-th) rectangular region are "√2" respectively. In addition, the area ratios $\lambda_1$, $\lambda_2$, $\lambda_3$ of the 1-st, 2-nd, 3-rd rectangular regions 297 are 0.8 respectively, the area ratio $\lambda_4$ of the 4-th rectangular region 297 is 0.2, the area ratios $\lambda_5$, $\lambda_6$, $\lambda_7$ of the 5-th, 6-th, 7-th rectangular regions 297 are 0 respectively, and the area ratio $\lambda_8$ of the 8-th rectangular region 297 is 0.4. That is, $$\eta_0 = 0.8 \cdot f(0) + 0 \cdot (f(1) + f(\sqrt{2}) + f(1)) + 0.4 \cdot f(\sqrt{2}) +$$
$$0.8 \cdot (f(1) + f(\sqrt{2}) + f(1)) + 0.2 \cdot f(\sqrt{2})$$
$$= 0.8 f(0) + 1.6 f(1) + 1.4 f(\sqrt{2})$$

By calculating all $\eta_i$ in the same manner as above, $Q_i$ in the i-th rectangular region 297 can be derived. Among plural $Q_i$'s in the block patterns within the one shot exposure range, the largest $Q_i$ is defined as $Q_{max}$.

In the meanwhile, since the divisional rectangular pattern 296 of $S_x \cdot S_y$ has already been surrounded by the frame-like regions, $S_x \cdot S_y$ is not corrected in the region $Q_{max}$.

Based on the exposure correction coefficient $Q_i$ obtained as above, the dimension $S_x$ of the divisional rectangular pattern 296 is corrected to $U_x$ and the dimension $S_y$ of the same is corrected to $U_y$. The following is the equation for correction. Here $U_{xi}$ denotes the i-th dimension in the x direction while $U_{yi}$ denotes the i-th dimension in the y direction.

$$U_{xi} = \left(\sqrt{Q_i} \Big/ \sqrt{Q_{\max}}\right) \cdot S_x \qquad (47)$$

$$U_{yi} = \left(\sqrt{Q_i} \Big/ \sqrt{Q_{\max}}\right) \cdot S_y \qquad (48)$$

Since $Q_i$, $Q_{max}$ are the correction coefficients as for areas, square roots of the correction coefficients $Q_i$, $Q_{max}$ are used in these equations to coincide their dimension to each other.

From these equations (47), (48), the following equation can be obtained.

$$U_{xi} \cdot U_{yi} (Q_i/Q_{max}) \cdot S_x \cdot S_y \qquad (49)$$

Besides, the equation (49) can be expressed from the above relation of $Q_i = 1/(1+C \cdot \eta_i)$ as follows:

$$U_{xi} U_{yi}(1+C \cdot \eta_i) = S_x \cdot S_y / Q_{max} = \text{constant} \qquad (50)$$

It can be seen from this relation that the equation representing the above $Q_i$, $\eta_i$, $U_{xi}$ $U_{yi}$ is a linear approximate correction expression with respect to the charged particle amount due to the proximity effect.

With the above, the divisional rectangular patterns 296 included in the rectangular regions 297 may corrected by the same amount by the same technique. As shown in FIG. 53, the corrected divisional rectangular patterns 296 are realized as the transmission holes 298.

To calculate 77 exactly, surface integral value of f(r) may be substituted for f(r) in the above equation (46).

Now the following shows a concrete example of the mask. The mask may be constituted by forming the transmission holes in the patterning region having a 20 $\mu$m thickness of the silicon substrate of a 600 $\mu$m thickness. $M_x$ and $M_y$ are 8 $\mu$m respectively; $2d_x$ and $2d_y$ are 2 $\mu$m respectively; $T_x$ and $T_y$ are 1 to 4 $\mu$m respectively; and C is 0.5 to 1.0 $\mu$m.

Note that various variations are also included in the present invention.

It would be understood that, although the rectangular pattern 290 is partitioned into four rectangular regions 297 in the above explanation, any number of regions are available.

In FIG. 52, in order to take diffraction of the charged particles and the proximity effect caused in sixteen outer regions as well as eight regions around the rectangular region 297 into consideration, the exposure correction coefficient Q may be calculated by further reducing the rectangular region 297.

In addition, it should be noted that the above Q or $\eta$ may be corrected based on actually obtained transfer patterns.

Moreover, the case where the size is corrected by reducing the divisional rectangular pattern has been explained in the first to third examples, but on the contrary the same result as above may be obtained to correct the size by magnifying the divisional rectangular pattern.

Besides, the size of the divisional rectangular patterns 296 may not be always identical to each other. For this reason, the divisional rectangular pattern having the larger size than those of peripheral patterns may be placed at the center of the rectangular pattern 290.

What is claimed is:

1. An electron beam exposure method comprising the step of:

providing an electron beam exposure mask which has electron beam shielding patterns for shielding charged particles, and a plurality of opening regions disposed along peripheral edges of said electron beam shielding patterns and divided by bridging portions, wherein each of said bridging portions has a length not to be resolved in an EB resist by scattering of said charged particles in an alignment direction of said opening regions, and each of said opening regions has a width formed narrowly by a bulge amount caused by said scattering of said charged particles in the direction intersecting said alignment direction; and forming latent images on an EB resist by charged particle patterns which are obtained by transmitting said electron beam through said electron beam exposure mask.

2. An electron beam exposure method comprising the step of:

forming a latent image pattern by irradiating first charged particles into an EB resist film; and flattening a distribution of reflected electron density in an entire region of said latent image pattern by irradiating second charged particles into said EB resist film.

3. An electron beam exposure method according to claim 2, wherein an exposure mask where a plurality of electron beam transmitting holes, each having aperture regions to flatten said distribution of said reflected electron density, are formed in corresponding regions of said second charged particles.

4. An electron beam exposure method comprising the steps of:

preparing an exposure mask having a plurality of electron beam transmitting holes formed on pattern non-forming regions around pattern forming regions; and irradiating charged particles on a resist by transmitting said charged particles via said electron beam transmitting holes;

wherein an irradiation amount of said charged particles being selected such that said resist is chemically changed to be soluble when said resist is of positive type, but chemically non-soluble when it is of negative type by a developer in entire pattern non-forming regions and that said resist is not exposed in said pattern forming regions.

5. An electron beam exposure method according to claim 4, wherein said resist is a positive-type resist, and said positive-type resist in said pattern non-forming regions to which said charged particles are irradiated is removed by said developer.

6. An electron beam exposure method according to claim 4, wherein said positive-type resist is exposed with different exposure amount in said pattern non-forming regions and in said pattern forming regions.

7. An electron beam exposure method comprising the steps of:

forming latent images on a negative-type resist by charged particle patterns which can be obtained by transmitting an electron beam through an electron beam exposure mask which has a plurality of openings disposed in a pattern forming region.

8. A charged particle beam exposure method, comprising the steps of:

preparing a mask including a mask substrate, first transmission holes formed on said mask substrate, second transmission holes via frames and having a smaller area than said first transmission holes, and a pattern constituted by a group of said first transmission holes and said second transmission holes; and forming one latent image in a resist by irradiating a charged particle beam into said resist through said first and second transmission holes of said mask.

9. A charged particle beam exposure method comprising the steps of:

providing a mask having openings formed in a standard rectangle respectively, said standard rectangle are partitioning one pattern forming region; and forming a latent image pattern in a resist by irradiating charged particles through the openings for a period of time T defined by the following formula:

$$T = To \cdot (Nx/Sx) \cdot (Ny/Sy)$$

wherein Nx and Ny are lengths of two sides defining standard rectangle, and Sx and Sy are lengths of two sides defining each of said openings, and To is a charged particle beam irradiation time when one opening is formed fully in an entire of said one pattern forming region as a transmission hole.

* * * * *